US010575419B2

(12) United States Patent
Huumala et al.

(10) Patent No.: US 10,575,419 B2
(45) Date of Patent: Feb. 25, 2020

(54) PACKAGE FOR HOUSING AN ELECTRIC OR ELECTRONIC COMPONENT

(71) Applicant: WURTH ELECTRONICS MIDCOM, INC., Watertown, SD (US)

(72) Inventors: Dean Huumala, Hayti, SD (US); Emil Nierges, Bayern (DE); Jared Quenzer, Watertown, SD (US); Adam Sullivan, Watertown, SD (US); Jesus Eduardo Maldonado Guzman, Watertown, SD (US)

(73) Assignee: WURTH ELECTRONICS MIDCOM, INC., Watertown, SC (US)

( * ) Notice: Subject to any disclaimer, the term of this patent is extended or adjusted under 35 U.S.C. 154(b) by 0 days.

(21) Appl. No.: 16/050,748

(22) Filed: Jul. 31, 2018

(65) Prior Publication Data

US 2019/0037714 A1    Jan. 31, 2019

Related U.S. Application Data

(60) Provisional application No. 62/539,481, filed on Jul. 31, 2017.

(51) Int. Cl.
| | | |
|---|---|---|
| *H05K 7/00* | (2006.01) | |
| *H05K 5/02* | (2006.01) | |
| *H05K 1/18* | (2006.01) | |
| *H05K 5/00* | (2006.01) | |
| *H01F 27/06* | (2006.01) | |
| *H01L 23/34* | (2006.01) | |
| *H01F 27/29* | (2006.01) | |

(Continued)

(52) U.S. Cl.
CPC .......... *H05K 5/0213* (2013.01); *H01F 27/06* (2013.01); *H01F 27/292* (2013.01); *H01L 23/34* (2013.01); *H05K 1/182* (2013.01); *H05K 3/301* (2013.01); *H05K 5/0026* (2013.01); *H05K 5/0091* (2013.01); *H01F 2027/065* (2013.01); *H01F 2027/295* (2013.01); *H05K 3/3421* (2013.01); *H05K 2201/1003* (2013.01)

(58) Field of Classification Search
USPC ........................................................ 361/728
See application file for complete search history.

(56) References Cited

U.S. PATENT DOCUMENTS

| | | |
|---|---|---|
| 4,498,067 A | 2/1985 | Kumokawa et al. |
| 5,565,837 A | 10/1996 | Godek et al. |
| 5,579,212 A | 11/1996 | Albano et al. |

(Continued)

*Primary Examiner* — Hung S. Bui
(74) *Attorney, Agent, or Firm* — Hamre, Schumann, Mueller & Larson, P.C.

(57) ABSTRACT

A package for housing an electric or electronic component is disclosed. The package includes a base and a header that includes a top portion and a support portion. The support portion has a first and a second end that defines a first and a second opening respectively. The top portion is secured to the first end and covers the first opening. The top portion includes a header vent to allow a substance (e.g., air, water, etc.) to flow into or out of an interior of the package. The header is configured to house the component therein. The header can be placed into a circular hole of the circuit board. The base is secured to the second end of the support portion, and is configured to secure the package to the circuit board. The vent can minimize moisture within the package and/or drain liquid from inside of the package.

10 Claims, 53 Drawing Sheets

(51) Int. Cl.
*H05K 3/30* (2006.01)
*H05K 3/34* (2006.01)

(56) References Cited

U.S. PATENT DOCUMENTS

| | | | |
|---|---|---|---|
| 6,081,180 A * | 6/2000 | Fernandez | H01F 17/062 |
| | | | 336/229 |
| 6,381,836 B1 * | 5/2002 | Lauruhn | H01L 23/4093 |
| | | | 165/185 |
| 6,587,023 B2 | 7/2003 | Miyazaki et al. | |
| 6,587,026 B2 | 7/2003 | Yeh et al. | |
| 8,451,082 B2 | 5/2013 | Espino | |
| 8,547,194 B2 | 10/2013 | Tseng et al. | |
| 9,378,885 B2 | 6/2016 | Hongzhong et al. | |
| 9,633,772 B2 | 4/2017 | Turnbull et al. | |
| 9,633,775 B2 * | 4/2017 | Fan | H05K 5/0247 |

* cited by examiner

PACKAGE FOR HOUSING AN ELECTRIC OR ELECTRONIC COMPONENT

FIELD

This disclosure relates generally to a package for housing an electric or electronic component.

BACKGROUND

Housings for electric and electronic components typically have mechanical properties to support internal components and to resist external force. Some housings can provide shielding from electromagnetic radiation to ensure proper functioning of the electric and electronic components. Some housings can facilitate the removal of heat generated by the electric and electronic components.

SUMMARY

This disclosure relates generally to a package for housing an electric or electronic component.

In some embodiments, the package houses the electric or electronic component therein. The package has at least one vent that allows a substance of any type or state (e.g., air, water, etc.) to flow into and out of an interior of the package where the electric or electronic component is housed.

In some embodiments, the vent can help minimize moisture within the package, and/or maximize air flow passing through the package. When, for example, a water wash process is applied, the vent can also help drain water from inside of the package to prevent the electric or electronic component housed inside the package from being damaged by water.

In some embodiments, the vent allows air to flow through the package to remove heat generated by the electric or electronic component. The removal of heat allows the electric or electronic component to have increased performance.

In some embodiments, the vent can also be used to facilitate the gripping and placement of the package to a desired location by grabbing the package through the vent(s). In some embodiments, the package can be picked by, for example, a suction cup placed on a surface of a header of the package.

In some embodiments, the package can have a cylindrical header that houses the electric or electronic component therein. It will be appreciated that in some embodiments, the header can be cylindrical. In other embodiments, the header can be conical, generally circular (defined as any convex polygon with 5 or more sides), or other suitable shape. In some embodiments, the cylindrical header can fit and protrude through a circular hole of a circuit board when the package is mounted on the circuit board. In other embodiments, the cylindrical header can be disposed above the hole when the package is mounted on the circuit board. It will be appreciated that any package disclosed in any one of the embodiments can be mounted on any circuit board disclosed in any one of the embodiments in a way such that the package either passes and protrudes through the circuit board or is on top/bottom of the circuit board.

In some embodiments, a package for housing an electric or electronic component is disclosed. The package includes a mount. The mount includes a header that includes a round top portion and a hollow cylindrical support portion. It will be appreciated that in some embodiments, the support portion can be cylindrical. In other embodiments, the support portion can be conical, generally circular (defined as any convex polygon with 5 or more sides), or other suitable shape. It will also be appreciated that in some embodiments, the top portion can be round. In other embodiments, the top portion can have other suitable shapes that match the shape of the support portion. The mount also includes a base. The hollow cylindrical support portion has a first end and a second end. The first end defines a first opening. The second end defines a second opening. The round top portion is secured to the first end of the hollow cylindrical support portion. The round top portion covers the first opening. The round top portion includes a header vent to allow a substance into and out of an interior of the hollow cylindrical support portion. The header is configured to house the electric or electronic component therein. The base is secured to the second end of the hollow cylindrical support portion. The base has a cavity. The base may include a terminal(s) that electrically connects the electrical or electronic component housed in the package to a circuit board. The base is configured to secure the package to the circuit board.

In some embodiments, an electric circuit system is disclosed. The electric circuit system includes a package for housing an electric or electronic component. The package includes a mount configured to house the electric or electronic component therein. The electric circuit system also includes a circuit board. The mount includes a cylinder header and a base secured to the cylinder header. It will be appreciated that in some embodiments, the header can be a cylinder header. In other embodiments, the header can be conical, generally circular (defined as any convex polygon with 5 or more sides), or other suitable shape. The cylinder header includes a first end and a second end. A top portion of the cylinder header is secured to the first end. The base is secured to the second end. The base may include a terminal(s) that electrically connects the electrical or electronic component housed in the mount to the circuit board. The base is configured to secure the package to the circuit board. The circuit board has a circular hole. The cylinder header aligns with the circular hole.

BRIEF DESCRIPTION OF THE DRAWINGS

References are made to the accompanying drawings that form a part of this disclosure and which illustrate embodiments in which the systems and methods described in this specification can be practiced.

FIG. 1A is an exploded view of the electric circuit system. FIG. 1B is a perspective top view of the electric circuit system. FIGS. 1C and 1D are perspective bottom views of the electric circuit system viewed from different angles. FIGS. 1E, 1F, 1G, and 1I are side views (front, back, left, right) of the electric circuit system viewed from different sides. FIG. 1H is a bottom view of the electric circuit system. FIG. 1J is a top view of the electric circuit system.

FIG. 2A is a perspective bottom view of the package. FIG. 2B is a perspective top view of the package. FIGS. 2C, 2D, 2E, and 2G are side views (front, back, left, right) of the package viewed from different sides. FIG. 2F is a bottom view of the package. FIG. 2H is a top view of the package.

FIG. 3A is a perspective bottom view of the mount. FIG. 3B is a perspective top view of the mount. FIGS. 3C, 3D, 3E, and 3G are perspective side views (front, back, left, right) of the mount viewed from different sides. FIG. 3F is a bottom view of the mount. FIG. 3H is a top view of the mount.

FIG. 3I is a perspective top view of the mount. FIGS. 3J, 3K, 3L, and 3N are perspective side views (front, back, left, right) of the mount viewed from different sides. FIG. 3M is a bottom view of the mount. FIG. 3O is a top view of the mount.

FIG. 4A is a perspective top view of the cap. FIGS. 4B, 4C, 4D, and 4F are perspective side views (front, back, left, right) of the cap viewed from different sides. FIG. 4E is a bottom view of the cap. FIG. 4G is a top view of the cap.

FIG. 5A is an exploded view of the electric circuit system. FIGS. 5B-5J are different views of the electric circuit system. FIGS. 5B and 5C are perspective bottom views of the electric circuit system viewed from different angles. FIG. 5D is a perspective top view of the electric circuit system. FIGS. 5E, 5F, 5G, and 5I are perspective side views (front, back, left, right) of the electric circuit system viewed from different sides. FIG. 5H is a bottom view of the electric circuit system. FIG. 5J is a top view of the electric circuit system.

FIG. 6A is a perspective bottom view of the package. FIG. 6B is a perspective top view of the package. FIGS. 6C, 6D, 6E, and 6G are perspective side views (front, back, left, right) of the package viewed from different sides. FIG. 6F is a bottom view of the package. FIG. 6H is a top view of the package.

FIG. 7A is a perspective bottom view of the package. FIG. 7B is a perspective top view of the package. FIGS. 7C, 7D, 7E, and 7G are perspective side views (front, back, left, right) of the package viewed from different sides. FIG. 7F is a bottom view of the package. FIG. 7H is a top view of the package.

FIG. 8A is a perspective top view of the package. FIGS. 8B, 8C, 8D, and 8F are perspective side views (front, back, left, right) of the package viewed from different sides. FIG. 8E is a bottom view of the package. FIG. 8G is a top view of the package.

FIG. 9A is a perspective top view of the package. FIGS. 9B, 9C, and 9E are perspective side views (front/back, left, right) of the package viewed from different sides. FIG. 9D is a bottom view of the package. FIG. 9F is a top view of the package.

FIG. 10A is a perspective bottom view of the package. FIG. 10B is a perspective top view of the package. FIGS. 10C, 10D, 10E, and 10G are perspective side views (front, back, left, right) of the package viewed from different sides. FIG. 10F is a bottom view of the package. FIG. 10H is a top view of the package.

FIG. 11A is a perspective bottom view of the package. FIG. 11B is a perspective top view of the package. FIGS. 11C, 11D, 11E, and 11G are perspective side views (front, back, left, right) of the package viewed from different sides. FIG. 11F is a bottom view of the package. FIG. 11H is a top view of the package.

FIG. 12A is a perspective top view of the package. FIGS. 12B, 12C, 12D, and 12F are perspective side views (front, back, left, right) of the package viewed from different sides. FIG. 12E is a bottom view of the package. FIG. 12G is a top view of the package.

Like reference numbers represent like parts throughout.

DETAILED DESCRIPTION

Figure 1A:
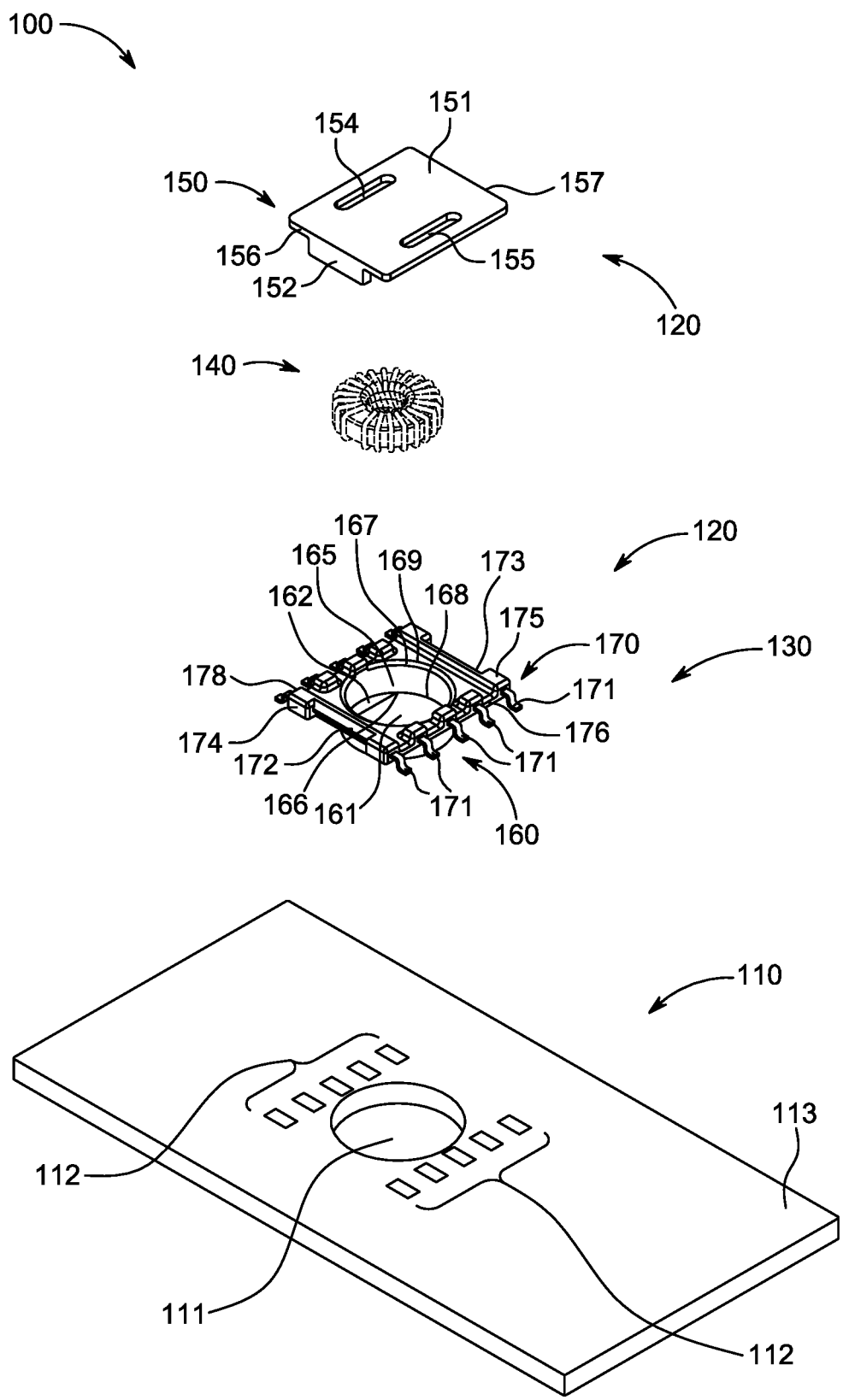
FIGS. 1A-1J illustrate different views of an electric circuit system, according to a first embodiment.
Figure 1B:
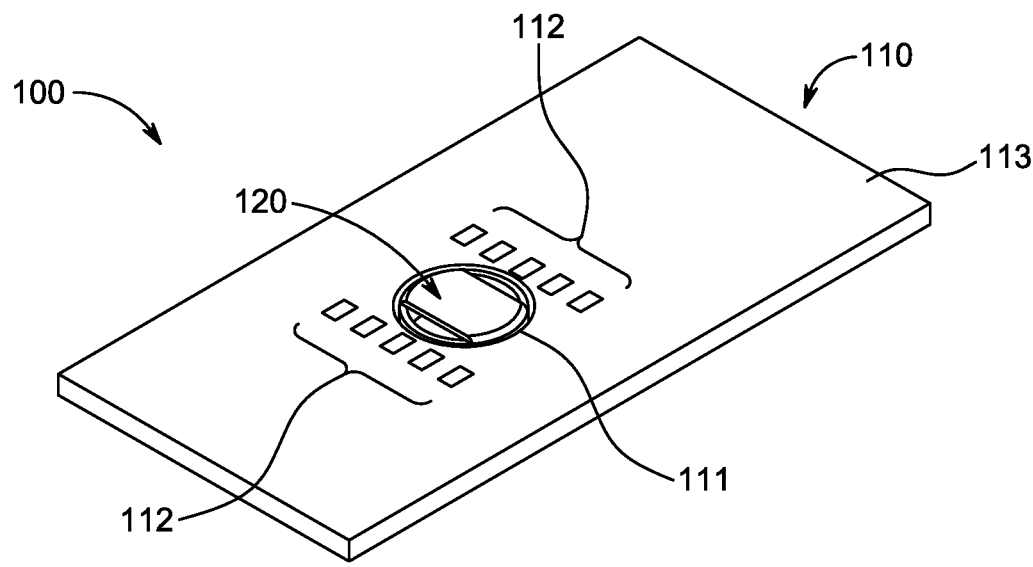
Figure 1C:
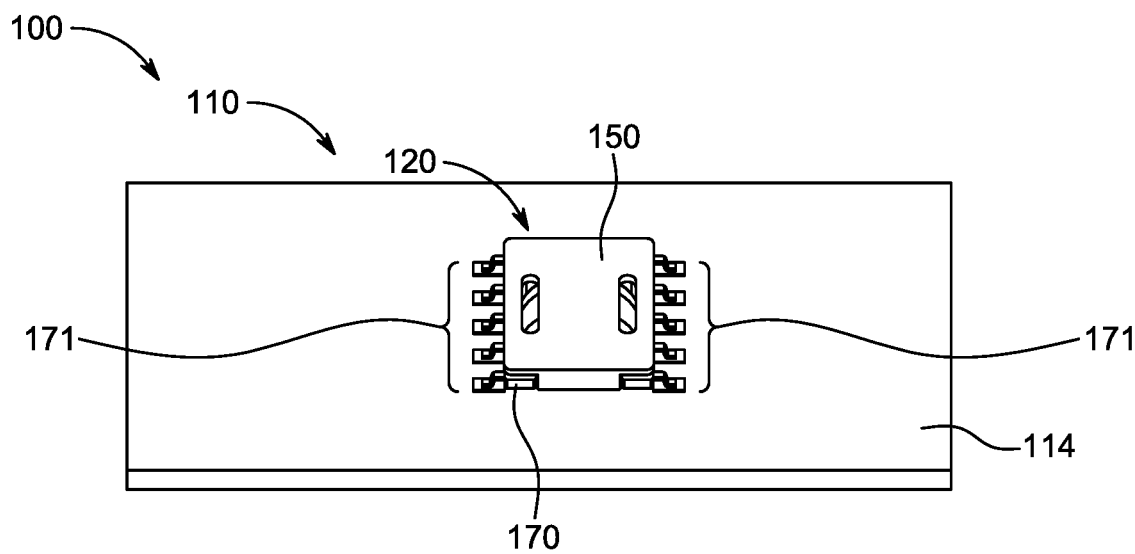
Figure 1D:
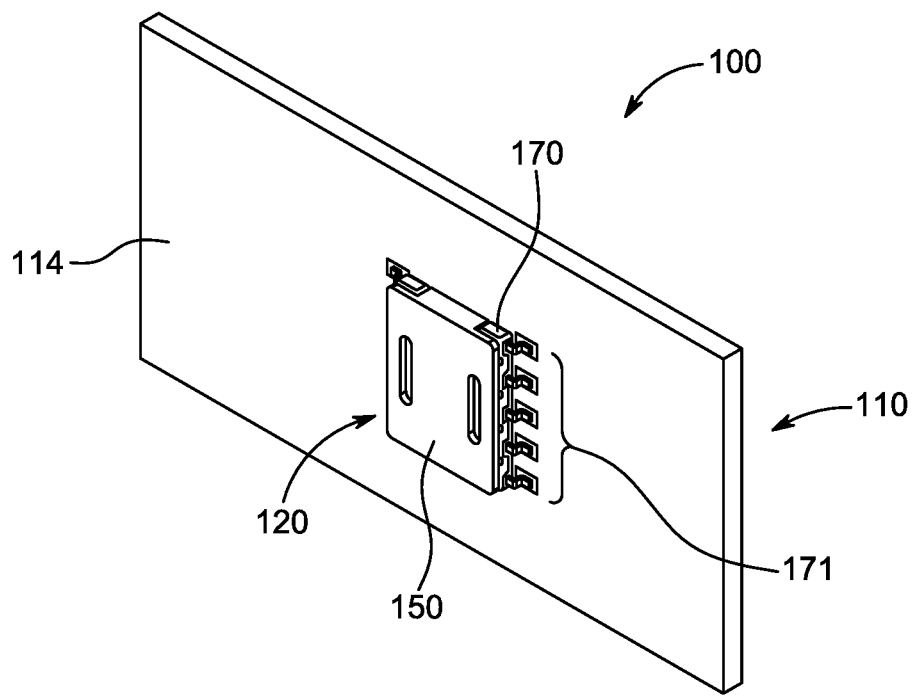
Figure 1E:
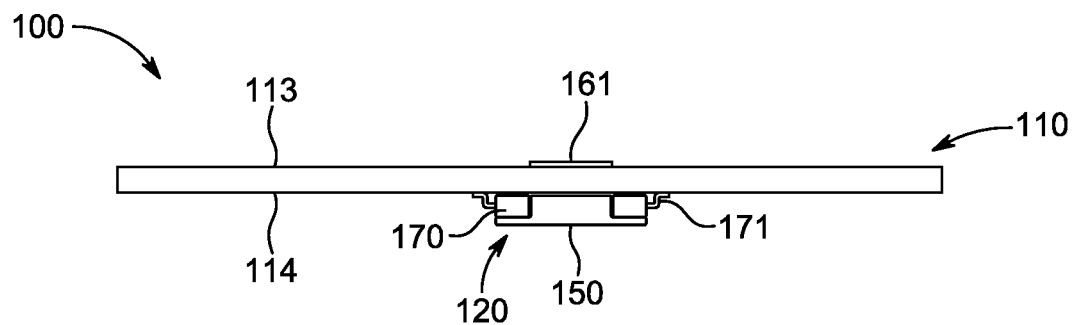
Figure 1F:
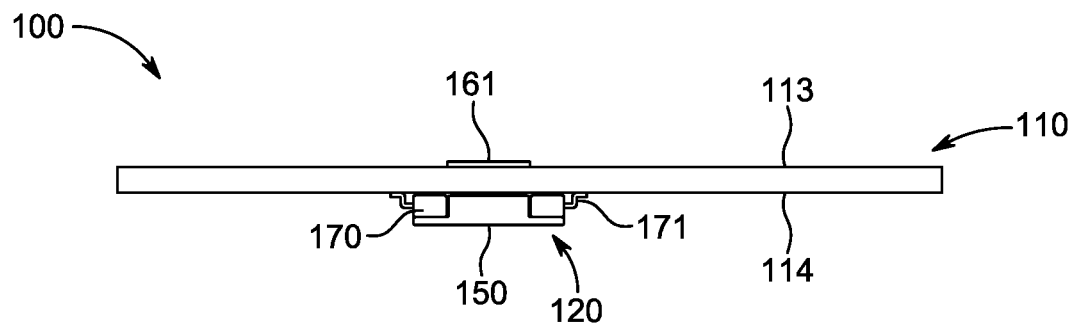
Figure 1G:
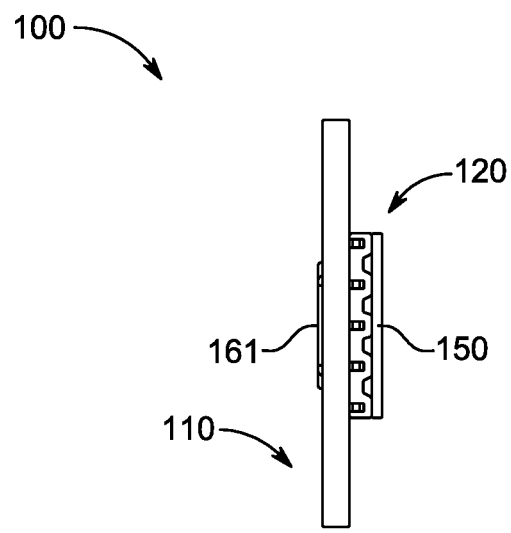
Figure 1H:
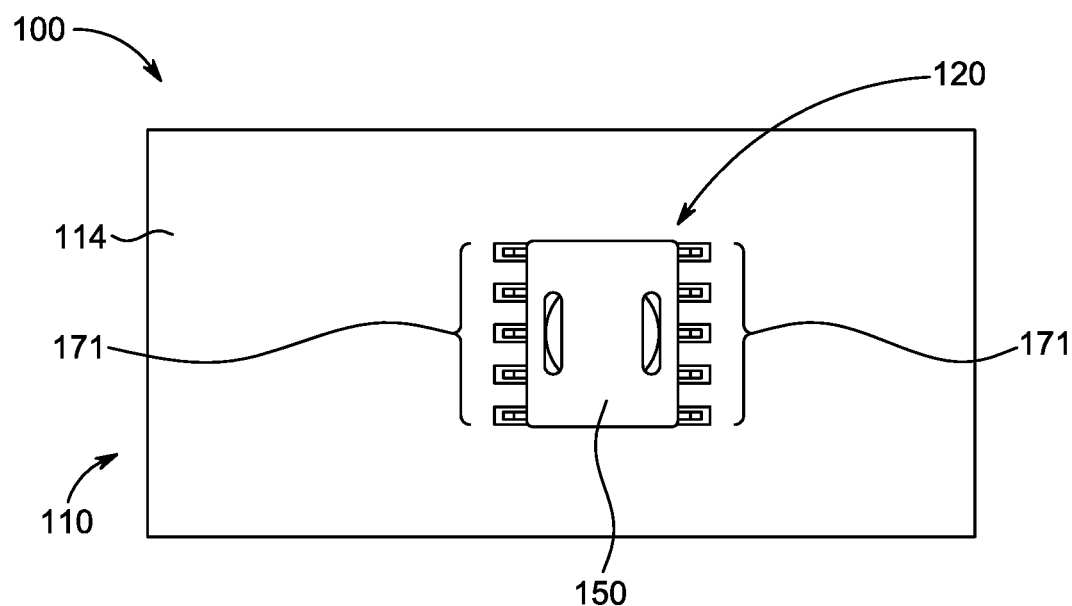
Figure 1I:
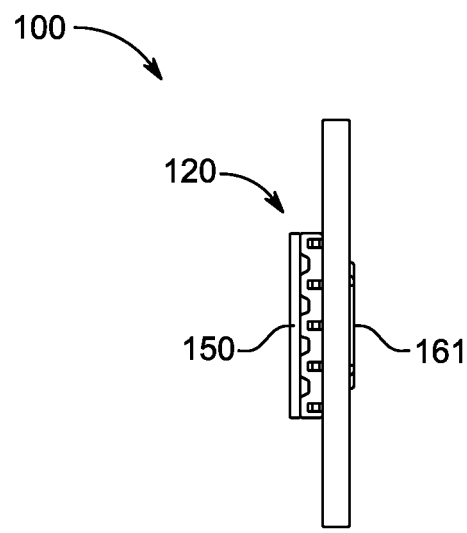
Figure 1J:
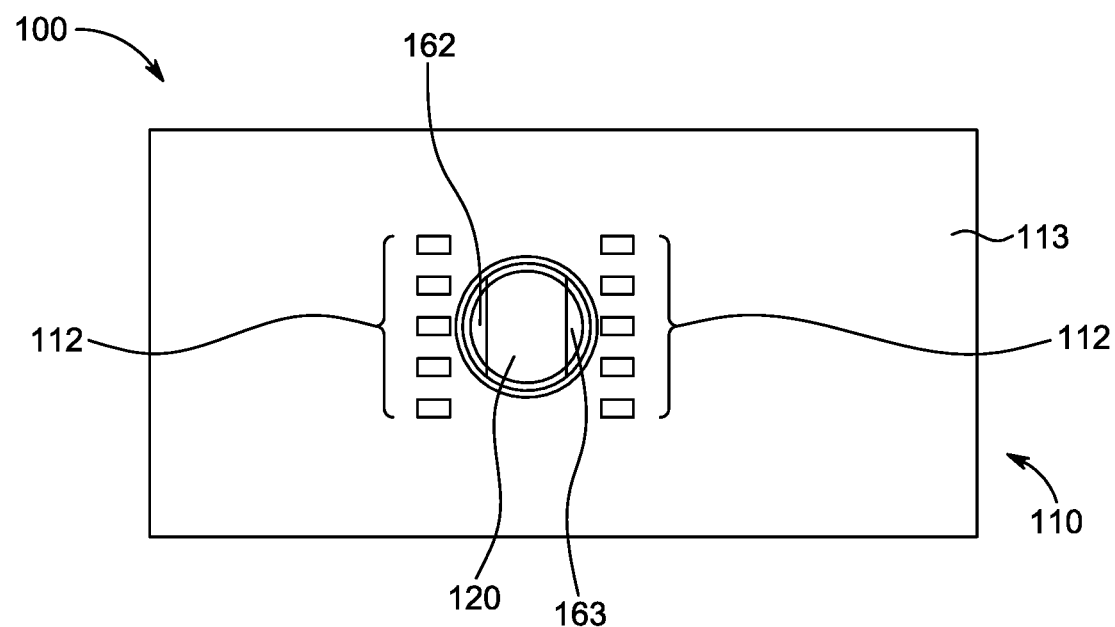
Figure 2A:
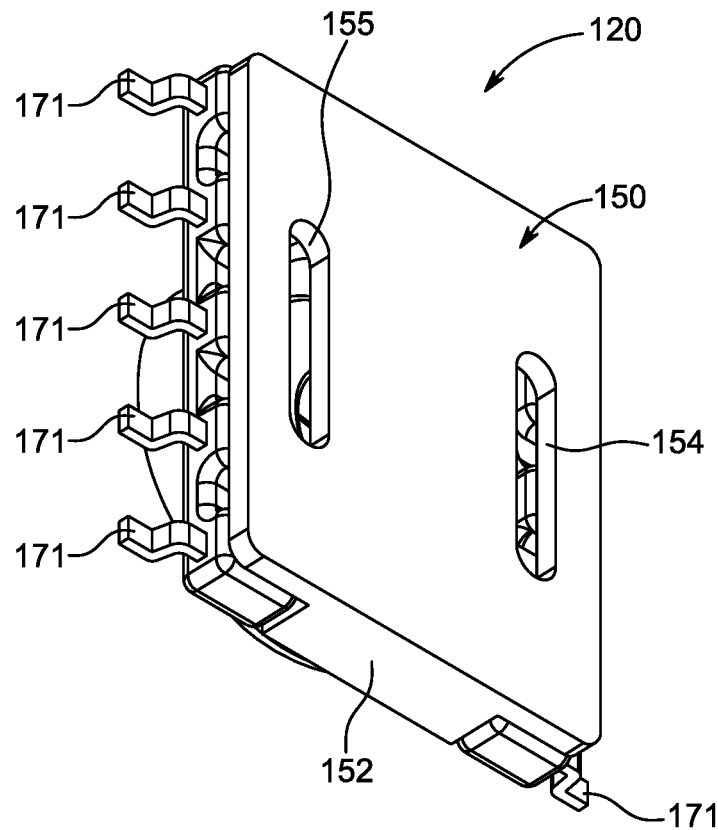
FIGS. 2A-2H illustrate different views of the package shown in FIGS. 1A-1J.
Figure 2B:
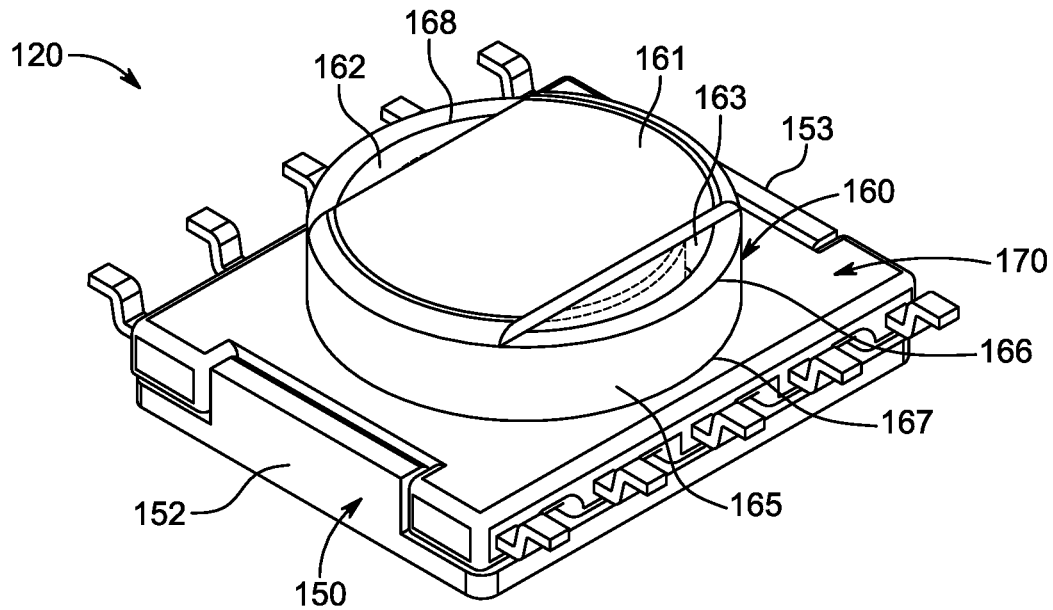
Figure 2C:
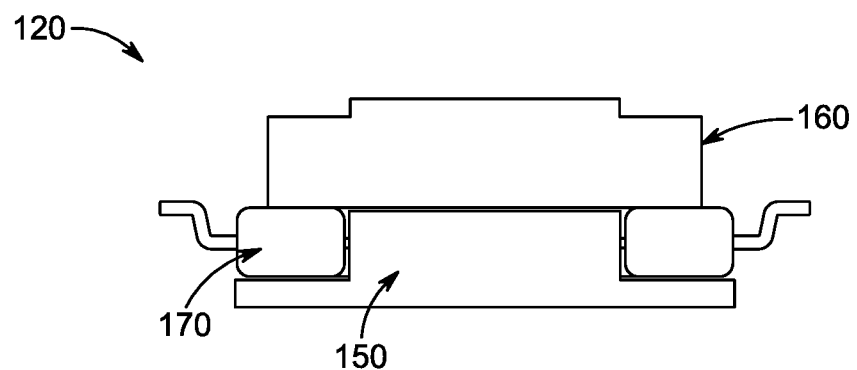
Figure 2D:
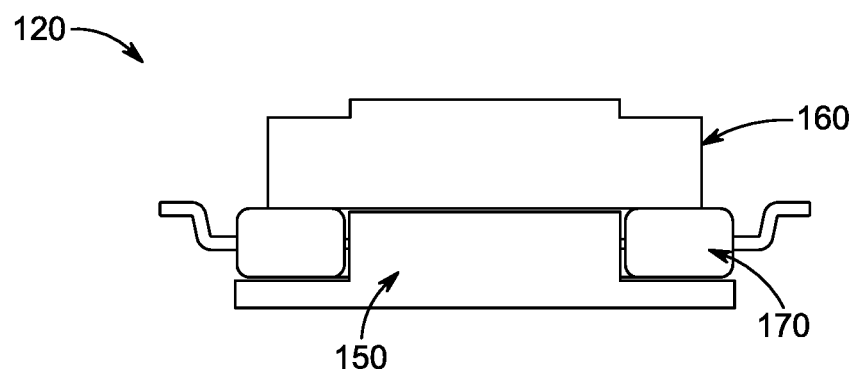
Figure 2E:
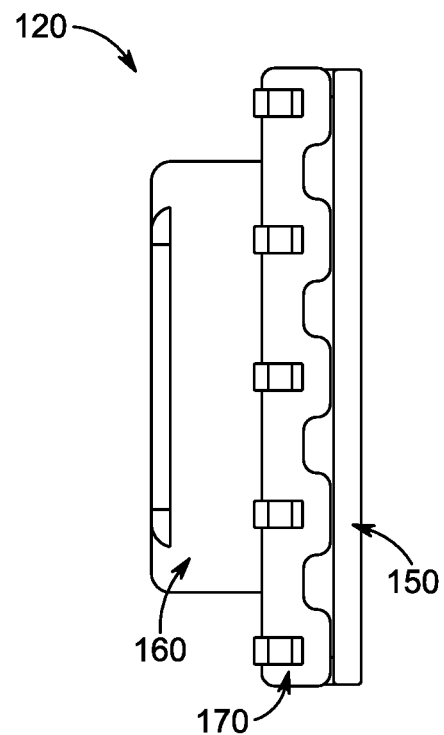
Figure 2F:
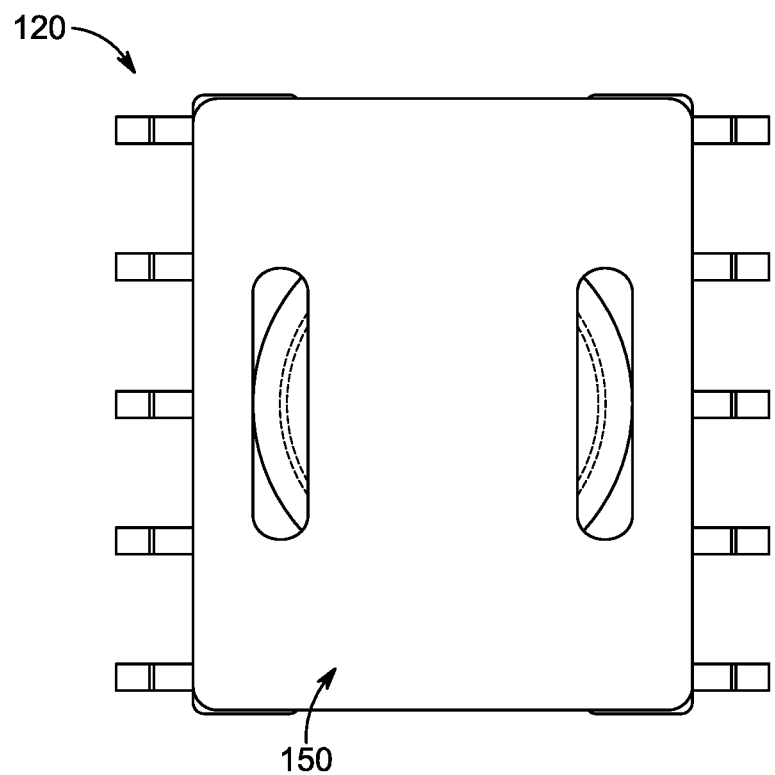
Figure 2G:
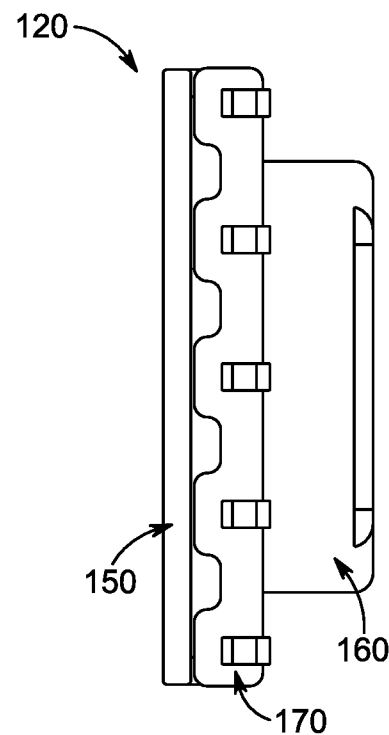
Figure 2H:
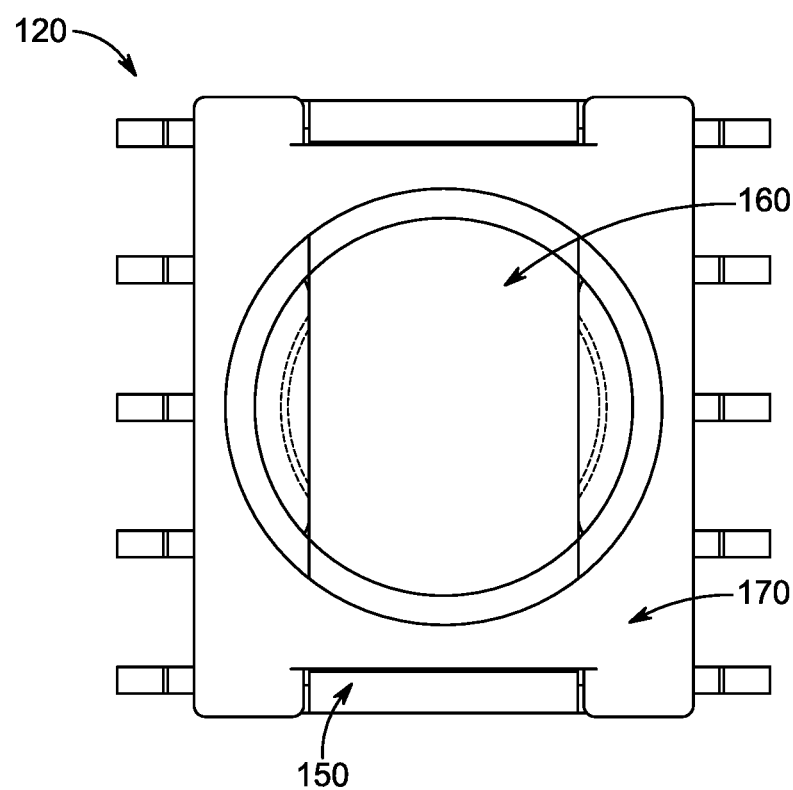
Figure 3A:
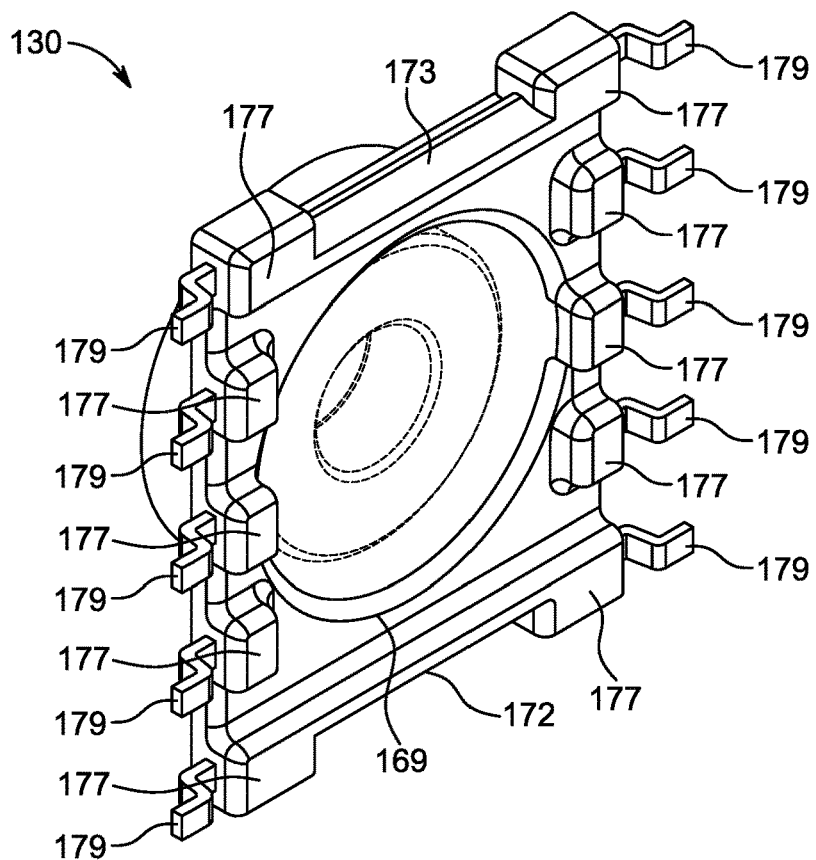
FIGS. 3A-3H illustrate different views of the mount with the electric or electronic component housed therein.
Figure 3B:
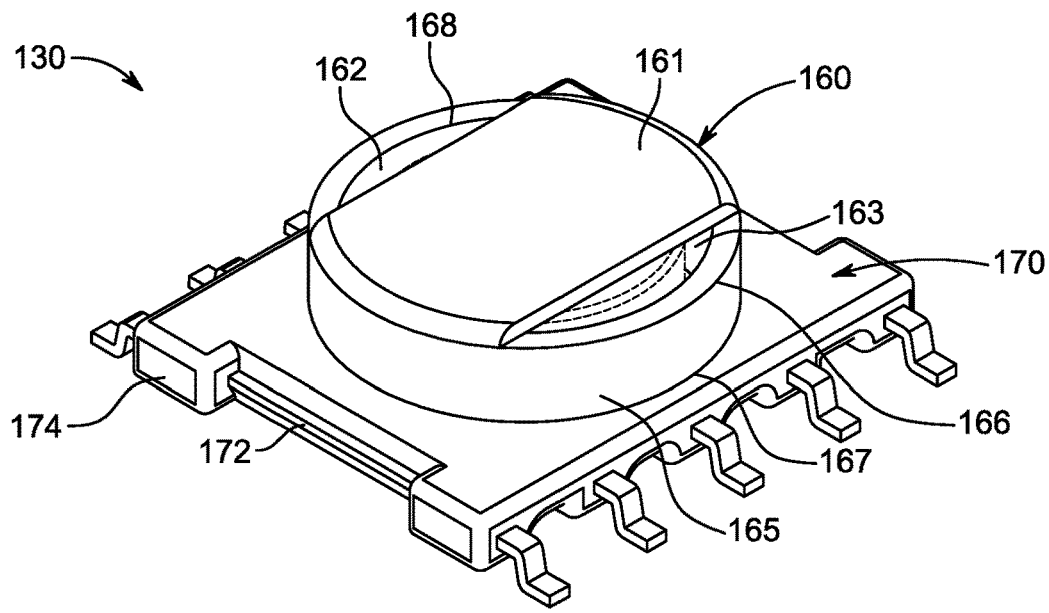
Figure 3C:
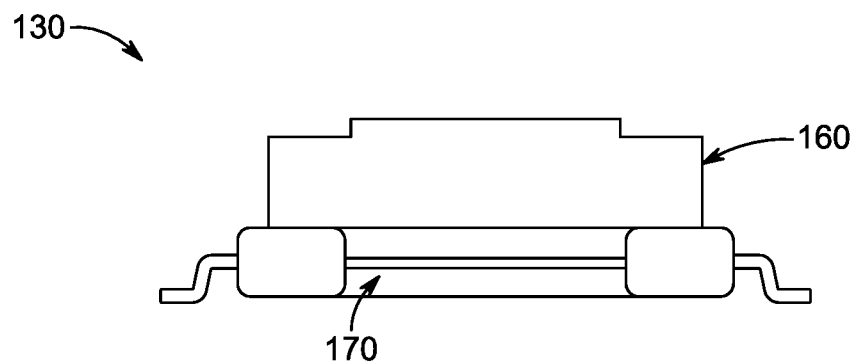
Figure 3D:
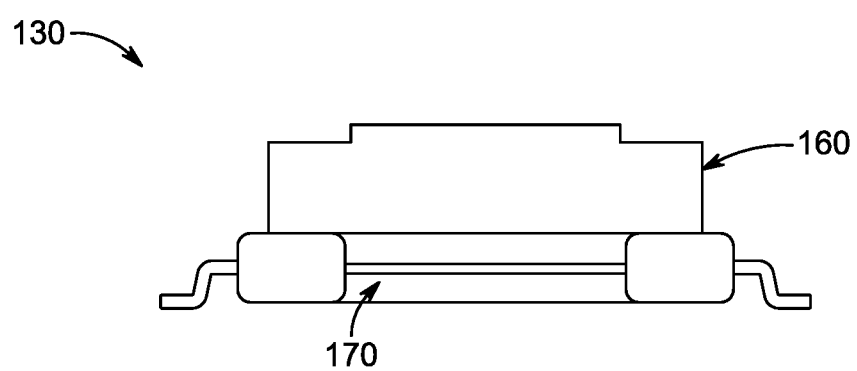
Figure 3E:
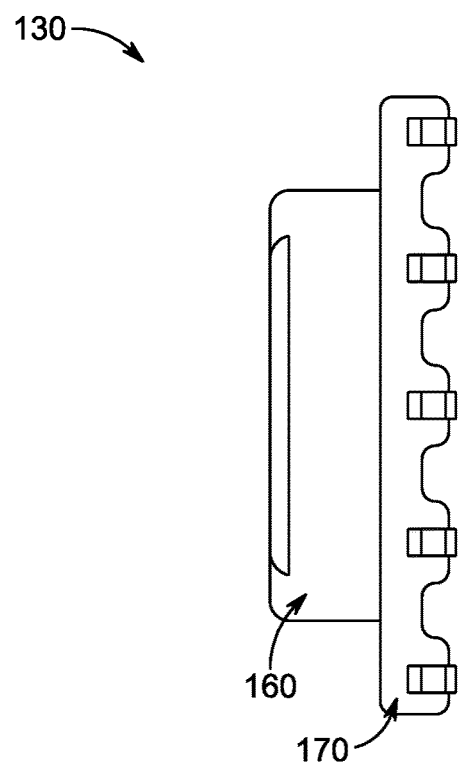
Figure 3F:
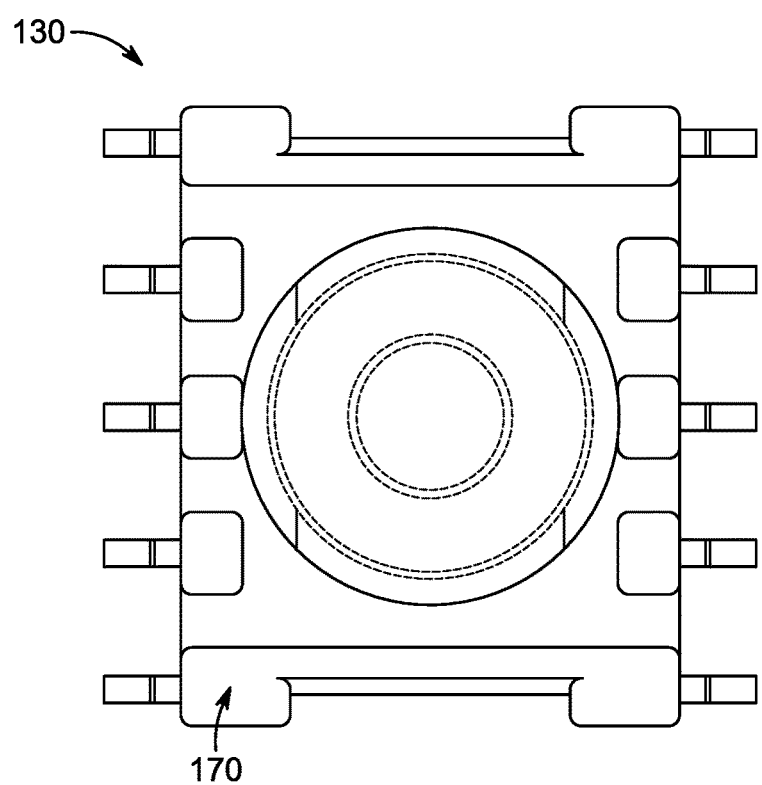
Figure 3G:
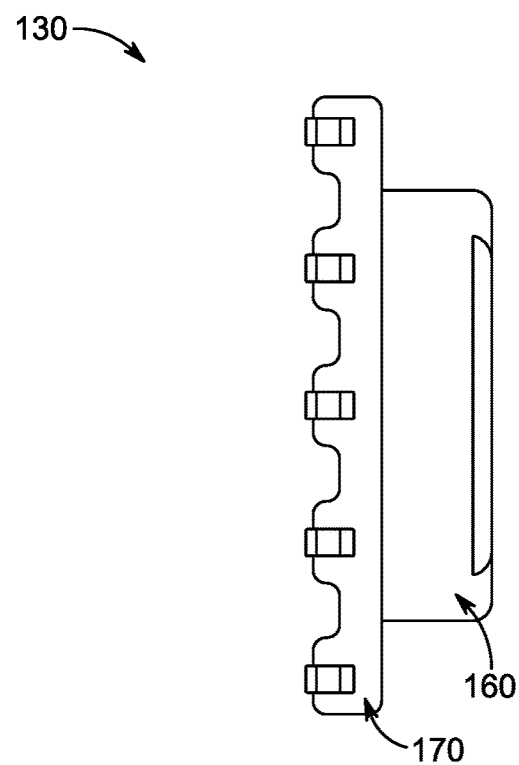
Figure 3H:
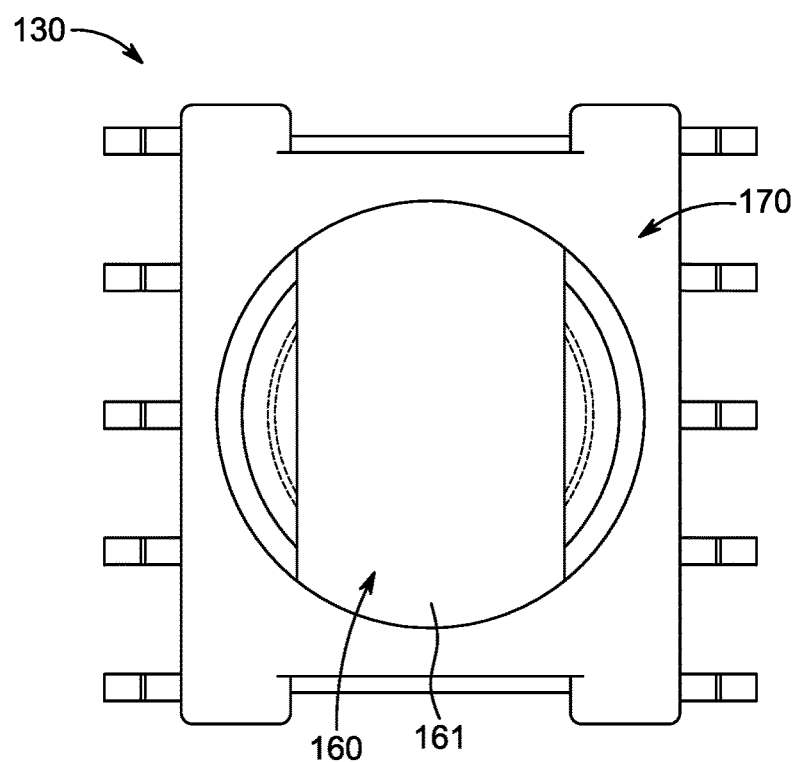
Figure 3I:
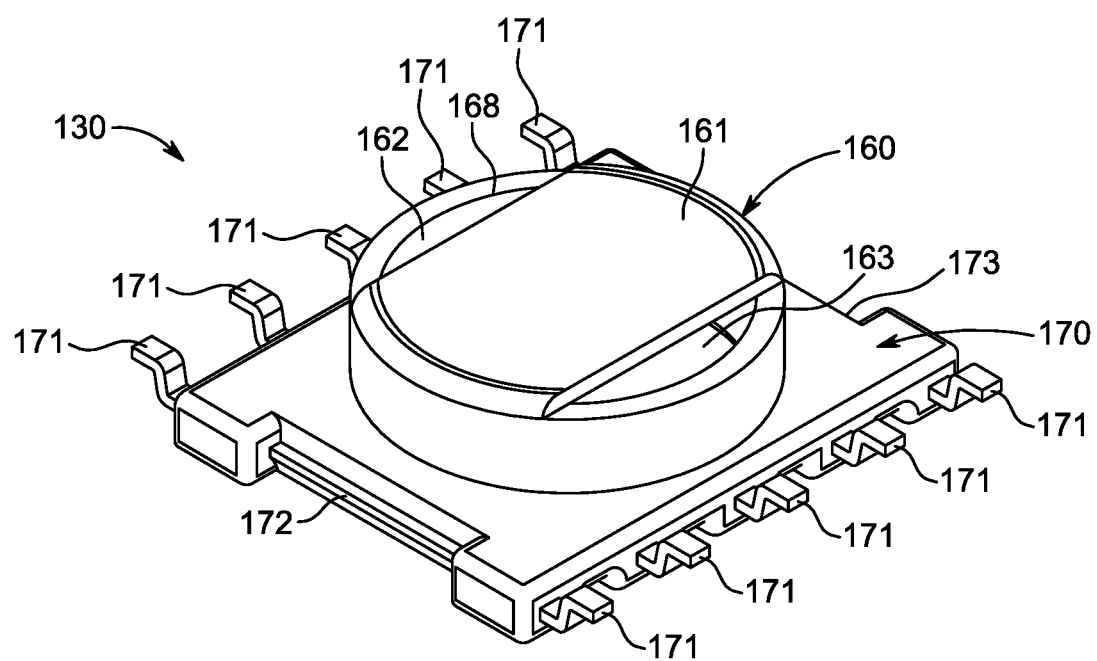
FIGS. 3I-3O illustrate different views of the mount without an electric or electronic component housed therein.
Figure 3J:
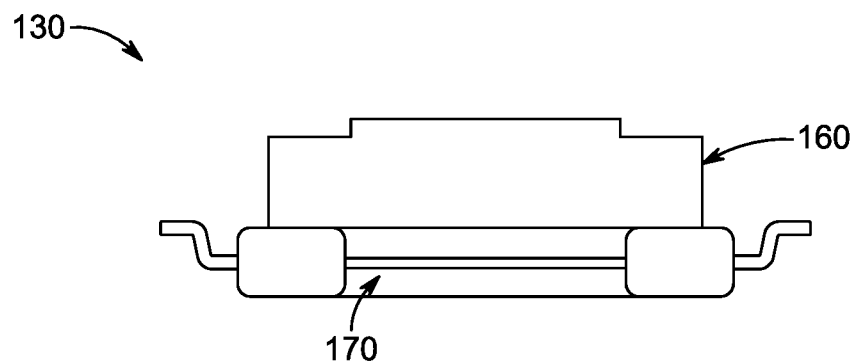
Figure 3K:
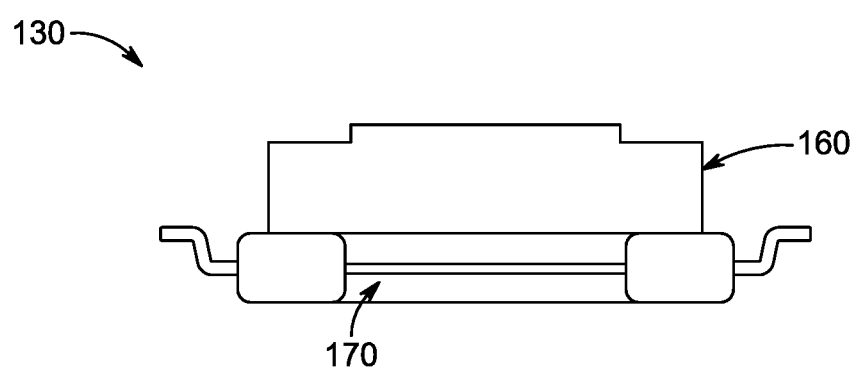
Figure 3L:
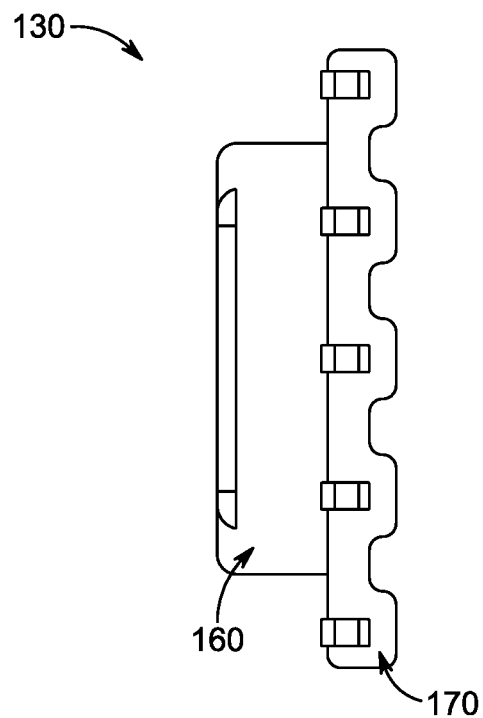
Figure 3M:
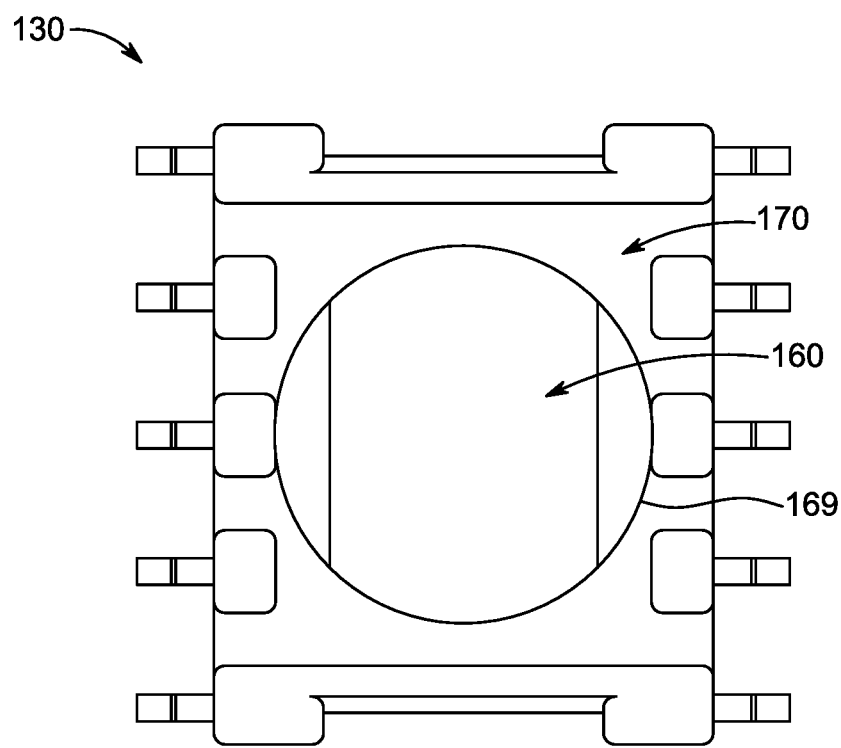
Figure 3N:
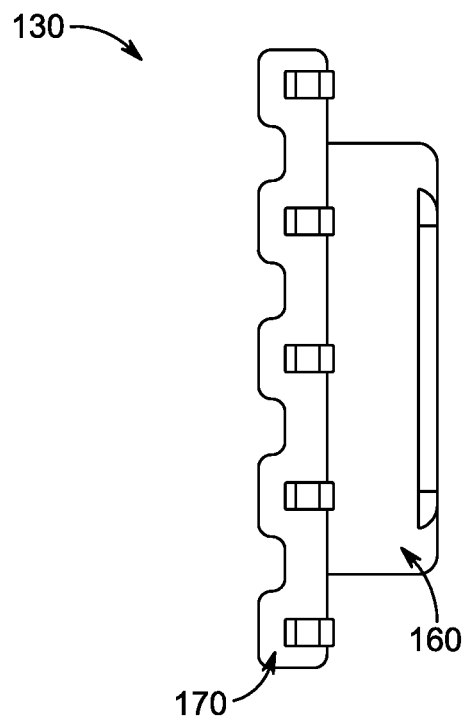
Figure 3O:
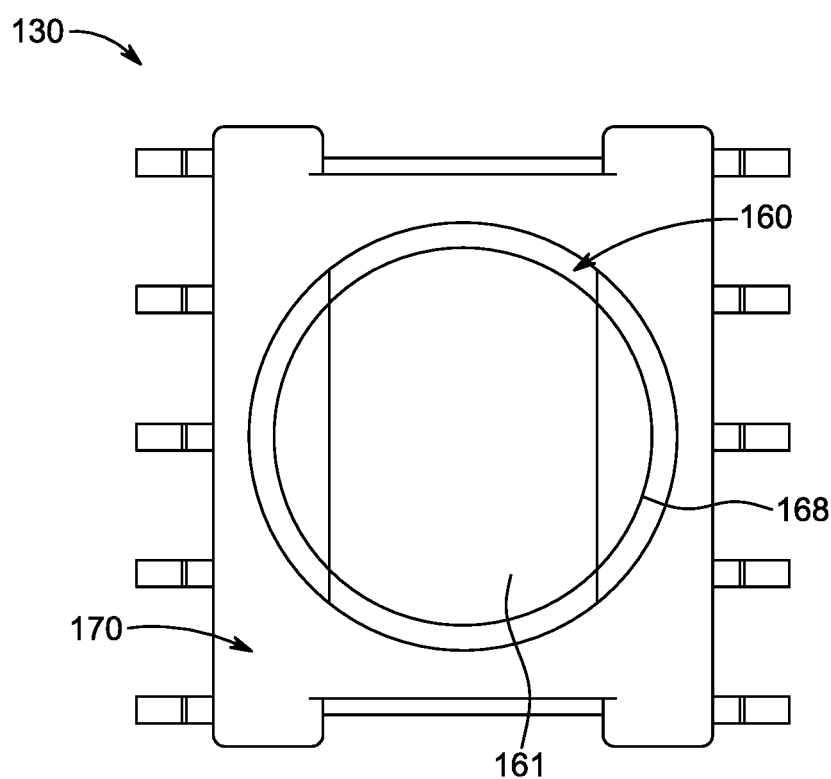
Figure 4A:
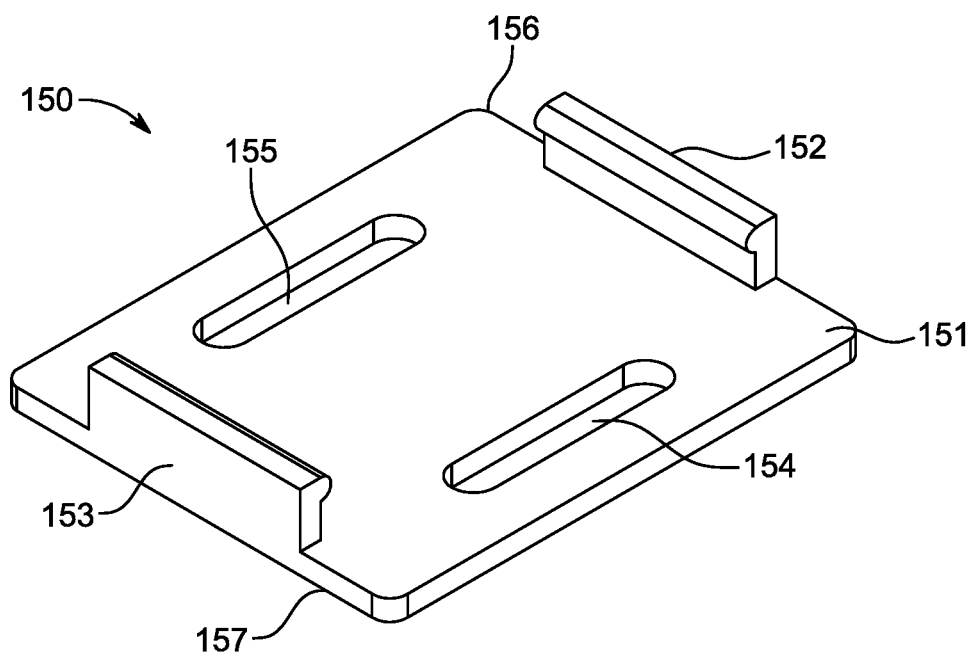
FIGS. 4A-4G illustrate different views of the cap.
Figure 4B:
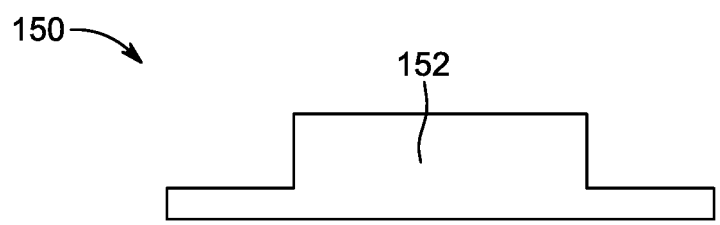
Figure 4C:
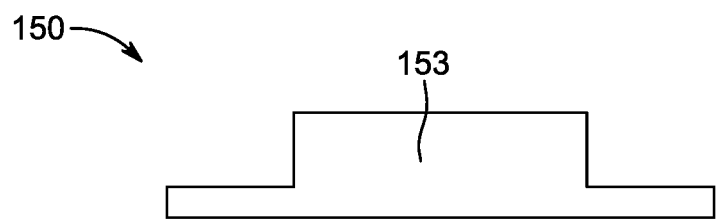
Figure 4D:
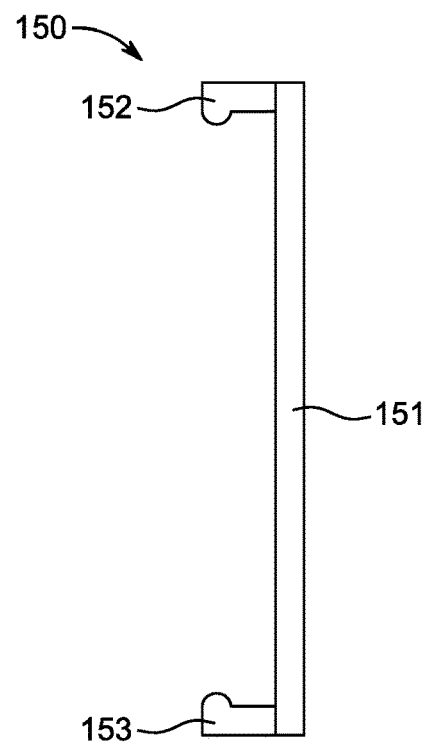
Figure 4E:
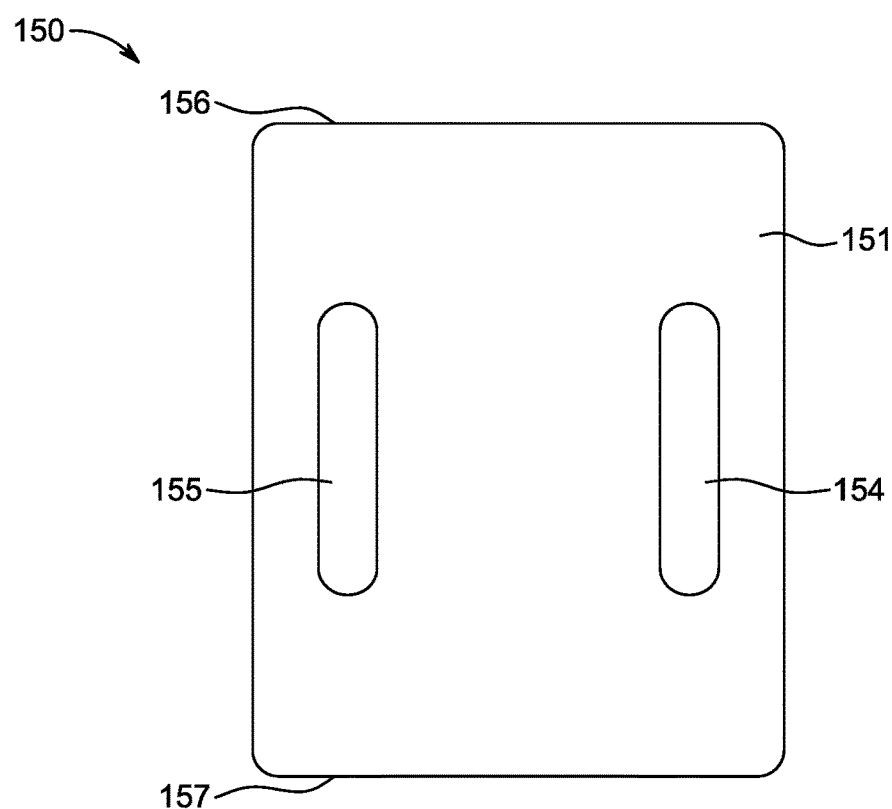
Figure 4F:
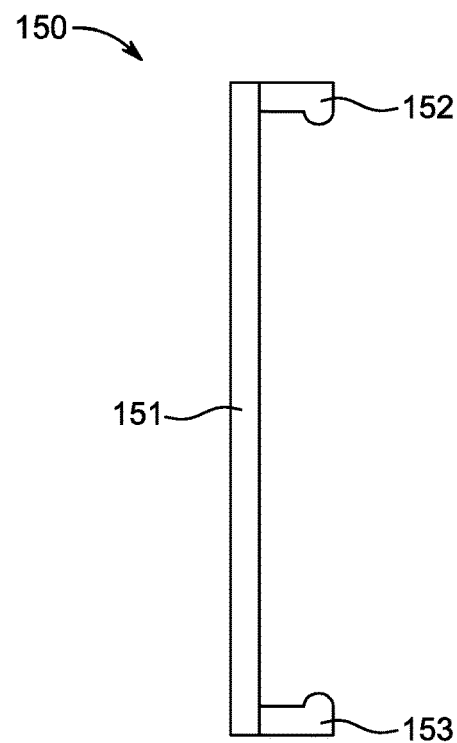
Figure 4G:
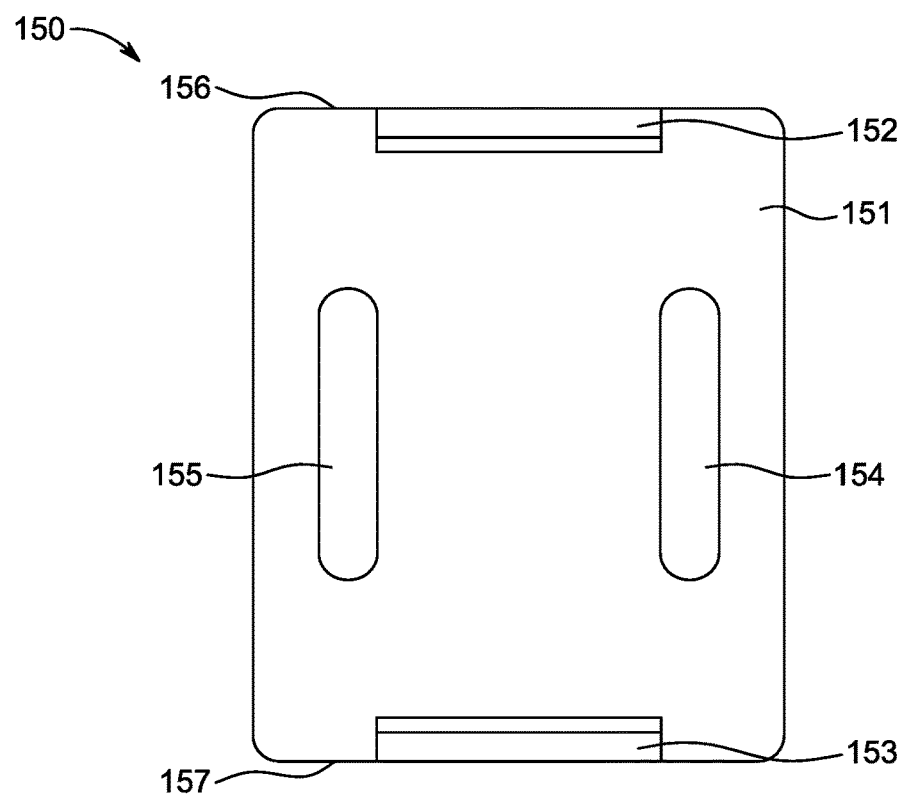

This disclosure relates generally to a package for housing an electric or electronic component.

FIGS. 1A-1J illustrate different views of an electric circuit system 100, according to a first embodiment. The electric circuit system 100 generally includes a circuit board 110 and a package 120. In some embodiments, the circuit board 110 can be a printed circuit board (PCB). The electric circuit system 100 can also include an electric (or electronic) component 140 housed within the package 120. The package 120 generally includes a mount 130 and a cap 150.

The mount 130 generally includes a header 160 and a base 170. See also FIGS. 3A-3H. The header 160 is generally configured to house the electric (or electronic) component 140 therein. The header 160 generally includes a top portion 161 and a support portion 165. The top portion 161 generally has a round shape. It will be appreciated that the top portion 161 can have any suitable shape. The top portion 161 generally has a first header vent 162 and a second header vent 163. It will be appreciated that the top portion 161 can have less or more vents. In some embodiments, the first header vent 162 and the second header vent 163 can have a circle segment shape or a semicircle shape. It will be appreciated that the first header vent 162 and the second header vent 163 can have any suitable shape. In some embodiments, the first header vent 162 and the second header vent 163 are located opposite to each other and along the circumference of the top portion 161. It will be appreciated that the first header vent 162 and the second header vent 163 can be located at any suitable locations on the top portion 161. It will also be appreciated that the first header vent 162 and the second header vent 163 can have any suitable size. However, if the size is too big, the strength of the package might be reduced, and there might be less area for the electric or electronic component to be attached and/or secured to the package with, for example, an adhesive.

In some embodiments, the support portion 165 generally has a cylindrical shape and is hollow for housing the electric component 140 therein. It will be appreciated that the cylindrical header 160 can fit and protrude through a circular hole 111 of a circuit board 110 when the package 120 is mounted on the circuit board 110. It will be appreciated that the cylindrical header 160 can be on top of the hole 111 when the package 120 is mounted on the circuit board 110. The support portion 165 generally has a first end 166 and a second end 167. The first end 166 defines a first opening 168. The second end 167 defines a second opening (not shown, see the second opening 169 in FIGS. 3A-3H). It will be appreciated that in some embodiments, the header and/or the support portion can be cylindrical. In other embodiments, the header and/or the support portion can be conical, generally circular (defined as any convex polygon with 5 or more sides), or other suitable shape.

In some embodiments, the top portion 161 of the header 160 is generally secured to the first end 166 of the support portion 165. The top portion 161 covers the first opening 168. An edge of the first opening 168 generally aligns with a circumference of the top portion 161. The first header vent 162 and the second header vent 163 are configured to allow a substance of any type or state (e.g., air, water, etc.) to flow into and out of an interior of the hollow support portion 165.

In some embodiments, the base 170 generally has a substantially rectangular or square shape. It will be appreciated that the base 170 can have any suitable shape. The base 170 is generally secured to the second end 167 of the support portion 165. The base 170 generally has a cavity (not shown). An edge of the second opening generally aligns with an edge of the cavity of the base 170. In some embodiments, the base 170 can include a plurality of terminals 171. In some embodiments, one or more of the plurality of terminals 171 can electrically connect the electrical (or electronic) component 140 housed in the package 120 to the circuit board 110. In some embodiments, one or more of the plurality of terminals 171 may not connect the electrical (or electronic) component 140 and may be used, for example, for securing/attaching the package to the circuit board. In some embodiments, the base 170 can be configured to secure the package 120 to the circuit board 110.

In some embodiments, the base 170 generally includes a first rail 172 and a second rail 173. The first rail 172 generally includes a first notch that recedes from a middle portion of a first edge 174 of the base 170. The first notch generally has a substantially rectangular shape. The second rail 173 generally includes a second notch that recedes from a middle portion of a second edge 175 of the base 170. The second notch generally has a substantially rectangular shape. The first edge 174 of the base and the second edge 175 of the base are opposite to each other. It will be appreciated that the first notch and the second notch can have any suitable shape.

In some embodiments, the cap 150 generally is configured to confine the electric (or electronic) component 140 between the mount 130 and the cap 150. The cap 150 generally includes bottom 151, a first protruding portion 152, and a second protruding portion 153. See also FIGS. 4A-4G. The first protruding portion 152 generally extends from a middle of a first edge 156 of the bottom 151 in a direction perpendicular to an outer surface of the bottom 151, and then extends in a direction parallel to the outer surface of the bottom 151 toward a second edge 157 of the bottom 151. The outer surface of the bottom 151 is generally flat. It will be appreciated that a suction device can suck on the outer surface of the bottom 151 to move the cap 150 to a desired location. The second protruding portion 153 generally extends from a middle of the second edge 157 of the bottom 151 in a direction perpendicular to an outer surface of the bottom 151, and then extends in a direction parallel to the outer surface of the bottom 151 toward the first edge 156 of the bottom 151. In some embodiments, the protruding portions 152 and 153 are configured to snap-fit the cap 150 to the rails 172 and 173 of the base 170. It will be appreciated that snap-fit is a term of art. Snap-fit is an assembly method used to attach flexible parts, usually plastic, to form the final product by pushing the parts' interlocking components together. Most snap-fit joints have a common design of a protruding edge (for example, the protruding portions 152 and 153 in FIG. 1A) and a snap-in area (for example, the rails 172 and 173 in FIG. 1A) that can be interlocked together. It will also be appreciated that in other embodiments, the cap can be mated or attached to the mount, the header, the electrical or electronic component, a terminal(s), the round top portion, the cavity, or the rail.

In some embodiments, the cap 150 generally includes a first cap vent 154 and a second cap vent 155. The first cap vent 154 generally aligns with the first header vent 162. The second cap vent 155 generally aligns with the second header vent 163.

In some embodiments, when the cap 150 is snap-fit to the base 170, a periphery of the cap 150 generally aligns with a periphery of the base 170. The first cap vent 154 and the second cap vent 155 are configured to allow a substance of any type or state (e.g., air, water, etc.) to flow into and out of the hollow support portion 165.

In some embodiments, the cap vents 154 and 155 can have a same or similar shape as the header vents 162 and 163. In other embodiments, the cap vents 154 and 155 can have a shape that is different from the header vents 162 and 163. For example, the cap vents 154 and 155 can have a shape similar to the two-dimensional representation of a spherocylinder (or a cylindrical capsule) or other suitable shape. The height of the cylindrical part of the shape is in a direction extends from the first edge 156 of the bottom 151 to the second edge 157 of the bottom 151.

In some embodiments, the header vents 162 and 163 and/or the cap vents 154 and 155 can advantageously minimize moisture within the hollow support portion 165, and/or maximize air flow passing into and out of the hollow support portion 165. The header vents 162 and 163 and/or the cap vents 154 and 155 can advantageously maximize the ventilation and/or evacuation of moisture or liquid. In some embodiments, water/liquid wash of the electric circuit system 100 can be conducted. The header vents 162 and 163 and/or the cap vents 154 and 155 can advantageously drain the water/liquid from inside of the package 120 so that the water/liquid is not trapped inside the package 120. If water/liquid is trapped inside the package 120, overtime, the electric (or electronic) component 140 housed inside the package 120 can be damaged. In some embodiments, the package 120 can be moved from where the package 120 is located. For example, a machine can grip and place the package 120 to a desired location by grabbing the package 120 through the header vents 162 and 163 and/or the cap vents 154 and 155. In other embodiments, the package can be gripped, for example, by a suction cup placed on a surface of the header 160 (for example, the top portion 161) of the package.

In some embodiments, the electric (or electronic) component 140 can be, for example, an inductive element, an inductor, a choke, a coil wound magnetics, a wound toroid, a capacitor, etc. The electric (or electronic) component 140 can be a donut-shape core with wire around the core. The electric (or electronic) component 140 can be secured to the top portion 161 of the package 120, for example, using adhesive material.

In some embodiments, the circuit board 110 has a hole 111. The hole 111 generally has a round shape. The round shape hole 111 can be easy to drill on the circuit board 110, and the drilling can typically be completed within minimized process (for example, a single drilling process). The size of the hole 111 is generally big enough so that the header 160 of the package 120 can pass through. The size of the hole 111 is generally small enough so that the base 170 of the package cannot pass through.

In some embodiments, the circuit board 110 generally includes a plurality of pads 112 on a first side 113 of the circuit board. It will be appreciated that the plurality of pads 112 can be on a second side (not shown) of the circuit board 110. Each one of the plurality of terminals 171 of the base 170 generally is configured to be secured on each one of the plurality of pads, respectively. In some embodiments, a half of the terminals 171 is located on a third edge 176 of the base, and another half of the terminals 171 is located on a fourth edge 178 of the base. The third edge 176 of the base and the fourth edge 178 of the base are opposite to each other. The terminals 171 can be configured to secure the package 120 to the circuit board 110.

FIGS. 1B-1J are different views of the electric circuit system 100, according to some embodiments. In FIGS. 1B-1J, the cap 150 snap-fits to the base 170, the electric (or electronic) component 140 is housed within the package 120, and each one of the plurality of terminals 171 is secured on each one of the plurality of pads (not shown) respectively.

In some embodiments, the plurality of pads 112 are on the first side 113 of the circuit board 110, and the plurality of pads (not shown) are on the second side 114 of the circuit board 110. The base 170 and the cap 150 of the package are located on the second side 114 of the circuit board 110, the top portion 161 of the header 160 is located on the first side 113 of the circuit board 110, and the support portion 165 of the header 160 is located substantially between the first side 113 and the second side 114 through the hole 111 of the circuit board 110. It will be appreciated that the base 170 and the cap 150 can be located on the first side 113, and that the top portion 161 of the header can be located on the second side 114.

FIGS. 2A-2H illustrate different views of the package 120 shown in FIGS. 1A-1J, according to the first embodiment. In FIGS. 2A-2H, the cap 150 snap-fits to the base 170, and the electric (or electronic) component 140 is housed within the package 120.

In some embodiments, each one of the plurality of terminals 171 includes a first segment extending from the base 170 in a direction parallel to an outer surface of the top portion 161. Each one of the plurality of terminals 171 can also include a second segment extending from the first segment toward the top portion 161 in a direction perpendicular to the outer surface of the top portion 161. Each one of the plurality of terminals 171 can further includes a third segment extending from the second segment away from the base 170 in a direction parallel to the outer surface of the top portion 161.

FIGS. 3A-3H illustrate different views of the mount 130 with the electric component 140 housed therein, according to the first embodiment.

In some embodiments, the first end 166 of the support portion 165 of the header 160 defines a first opening 168. The second end 167 of the support portion 165 of the header 160 defines a second opening 169.

In some embodiments, the package 120 does not have a cap. An electric (or electronic) component 140 can be housed in the package 120. The base 170 can include a plurality of terminals 179. Each one of the plurality of terminals 179 includes a first segment extending from the base 170 in a direction parallel to an outer surface of the top portion 161. Each one of the plurality of terminals 179 can also include a second segment extending from the first segment away from the top portion 161 in a direction perpendicular to the outer surface of the top portion 161. Each one of the plurality of terminals 179 can further includes a third segment extending from the second segment away from the base 170 in a direction parallel to the outer surface of the top portion 161.

It will be appreciated that every variation of terminals described in this disclosure can be replaced with any one of the variations described in this disclosure.

In some embodiments, the base 170 can include a plurality of sections 177. Each one of the plurality of sections 177 is spaced away from each other. The first segment of each one of the plurality of terminals 179 extends from each one of the plurality of sections 177, respectively. The number of sections 177 is typically the same as the number of terminals 179.

FIGS. 3I-3O illustrate different views of the mount 130 without an electric (or electronical) component housed therein, according to the first embodiment.

In some embodiments, the package 120 does not have a cap. The electric (or electronical) component is not housed in the package 120.

FIGS. 4A-4G illustrate different views of the cap 150, according to some embodiments.

Figure 5A:
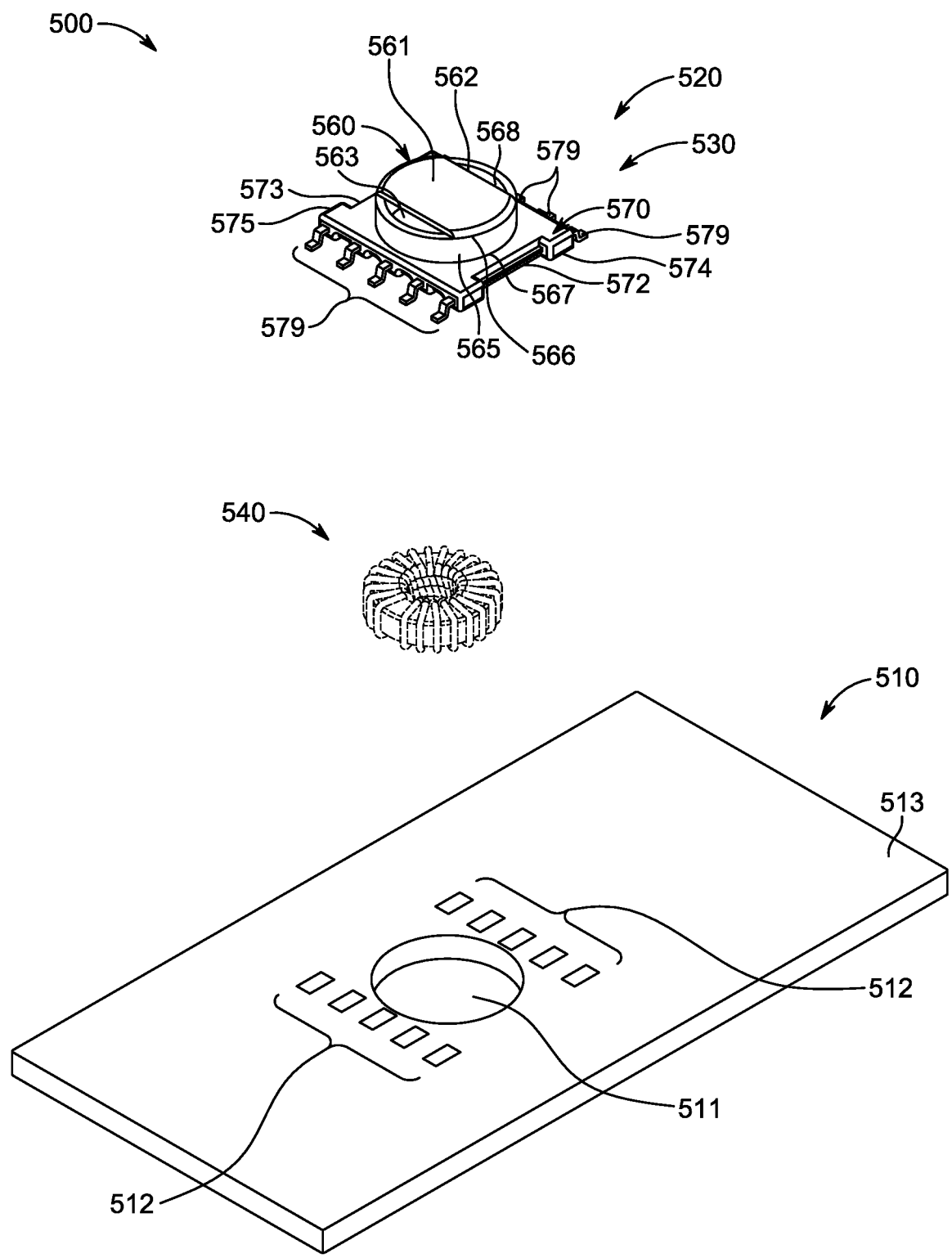
FIGS. 5A-5J illustrate different views of an electric circuit system, according to a second embodiment.
Figure 5B:
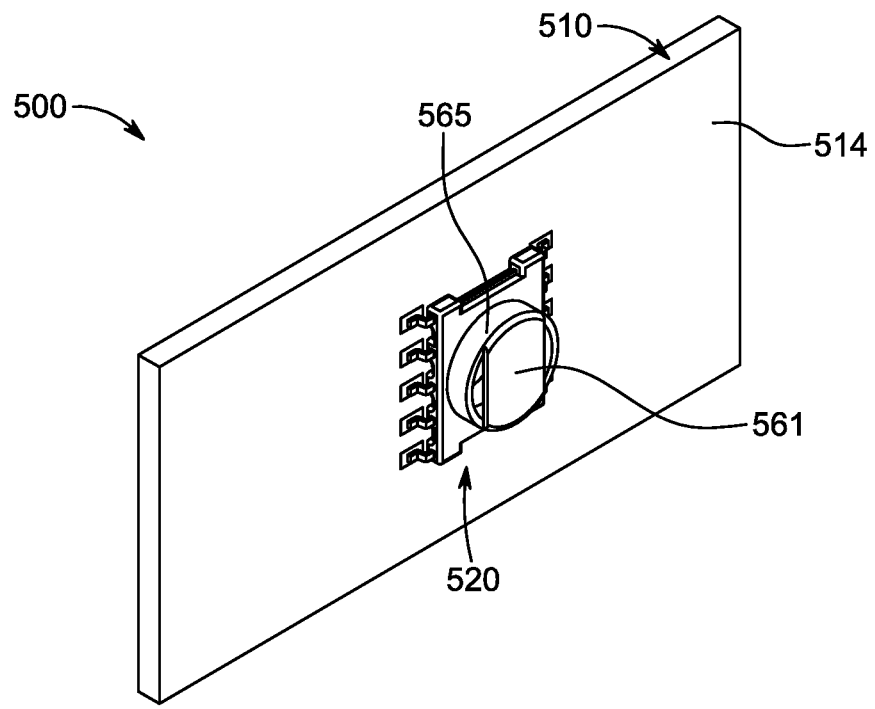
Figure 5C:
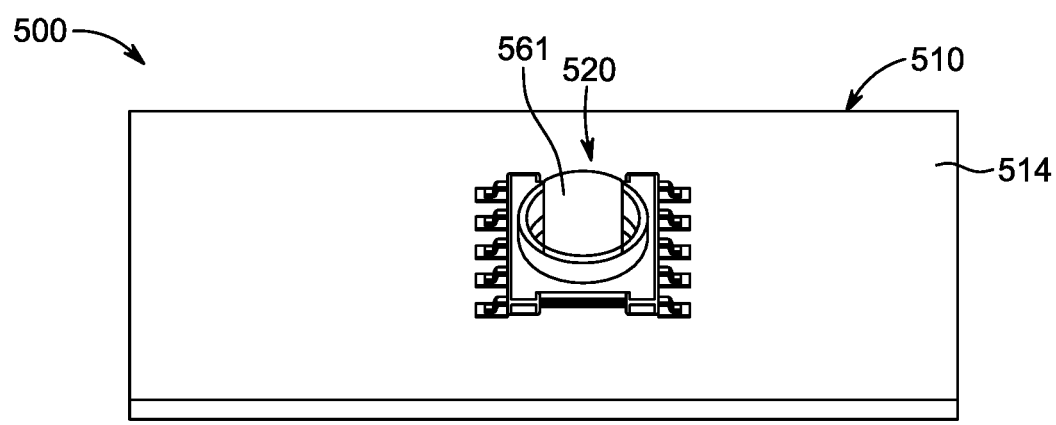
Figure 5D:
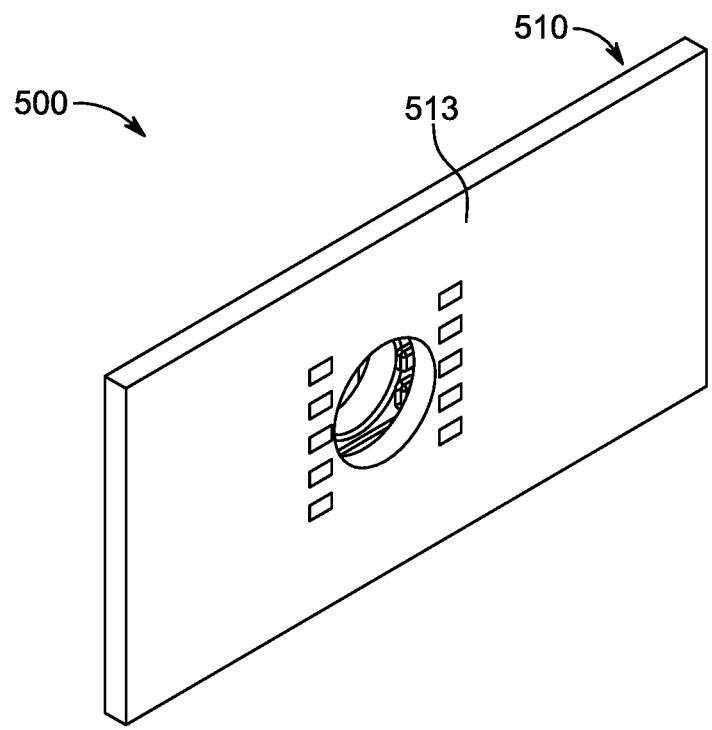
Figure 5E:
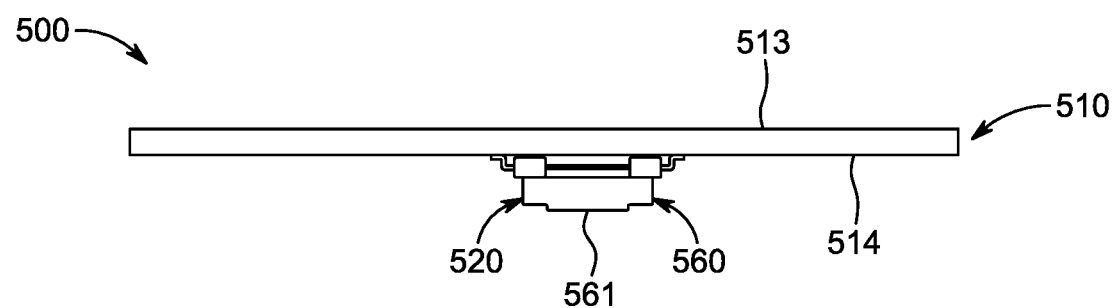
Figure 5F:
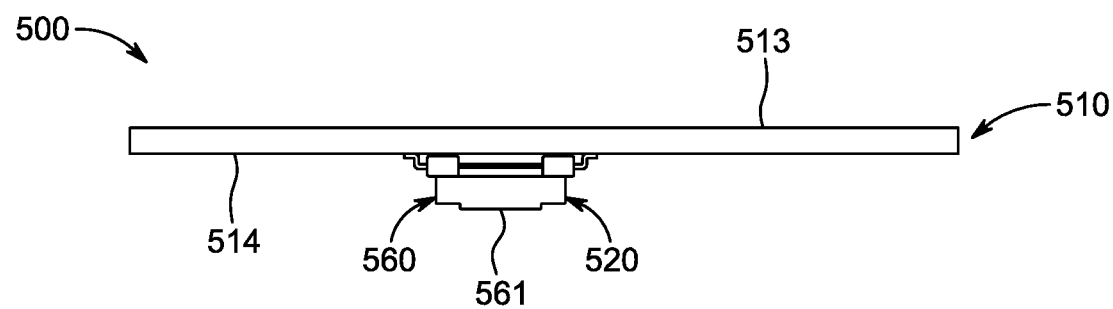
Figure 5G:
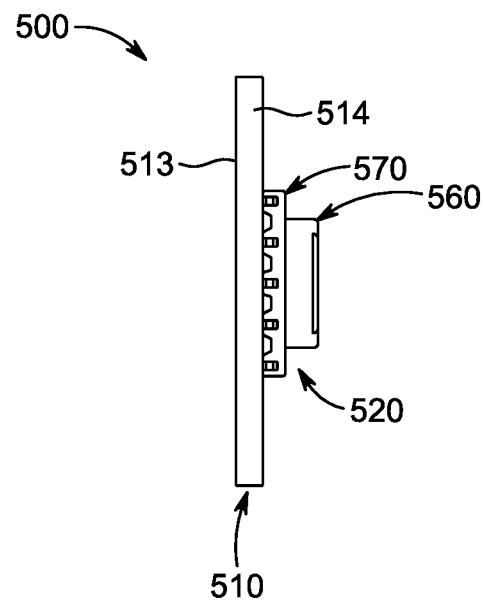
Figure 5H:
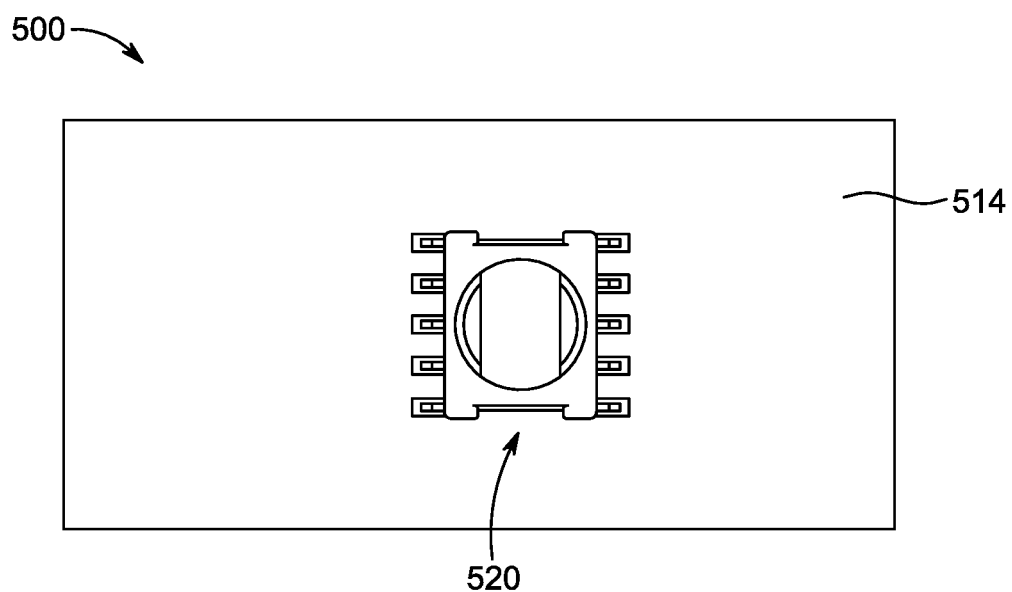
Figure 5I:
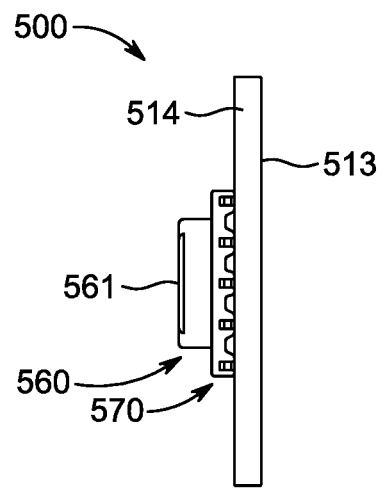
Figure 5J:
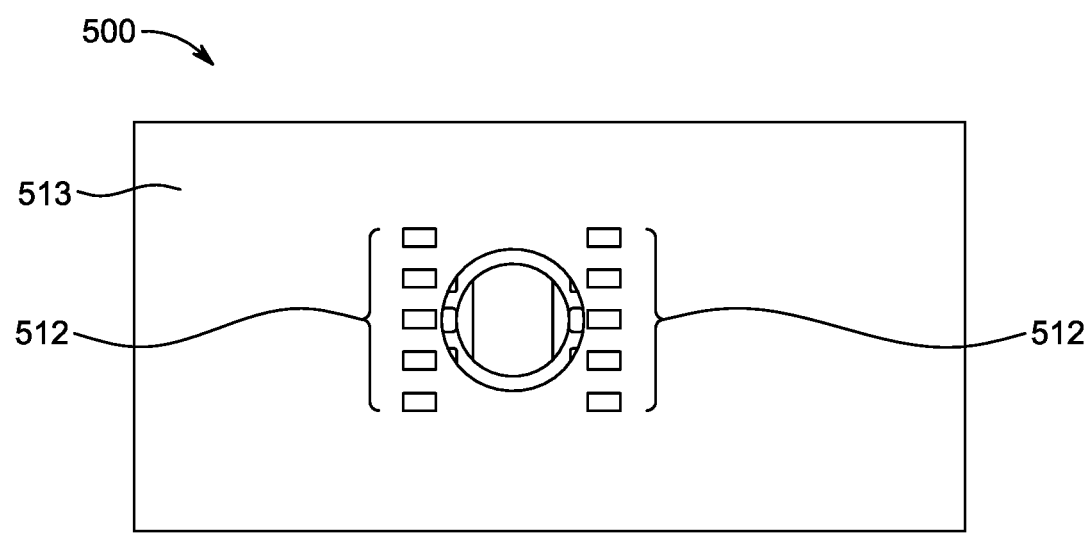
Figure 6A:
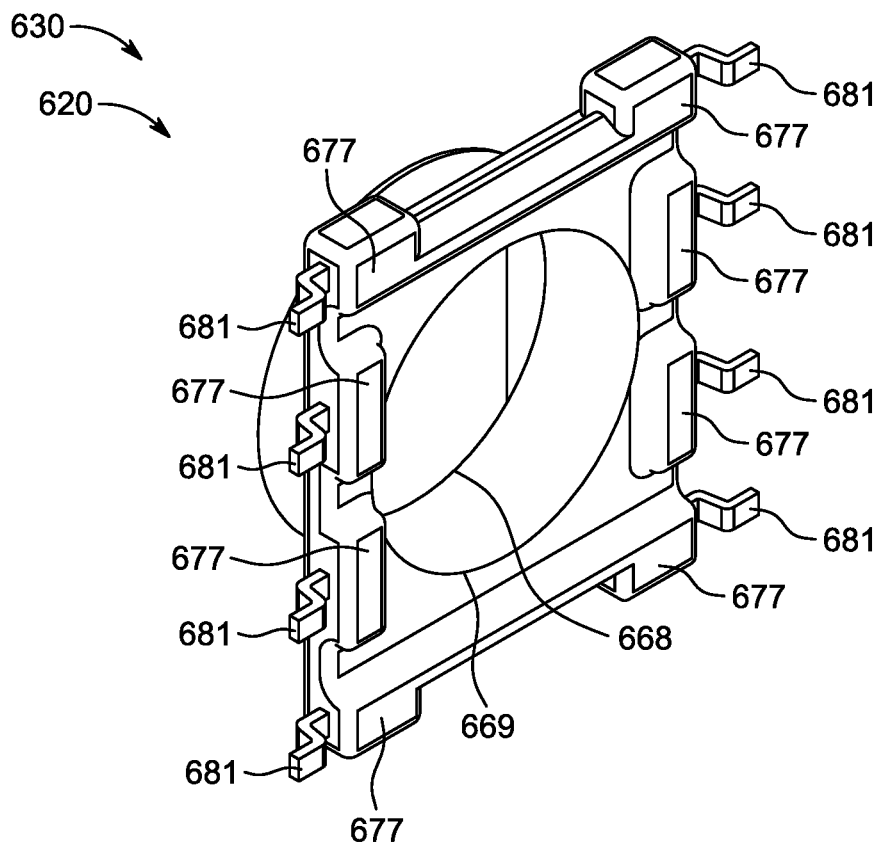
FIGS. 6A-6H illustrate different views of a package, according to a third embodiment.
Figure 6B:
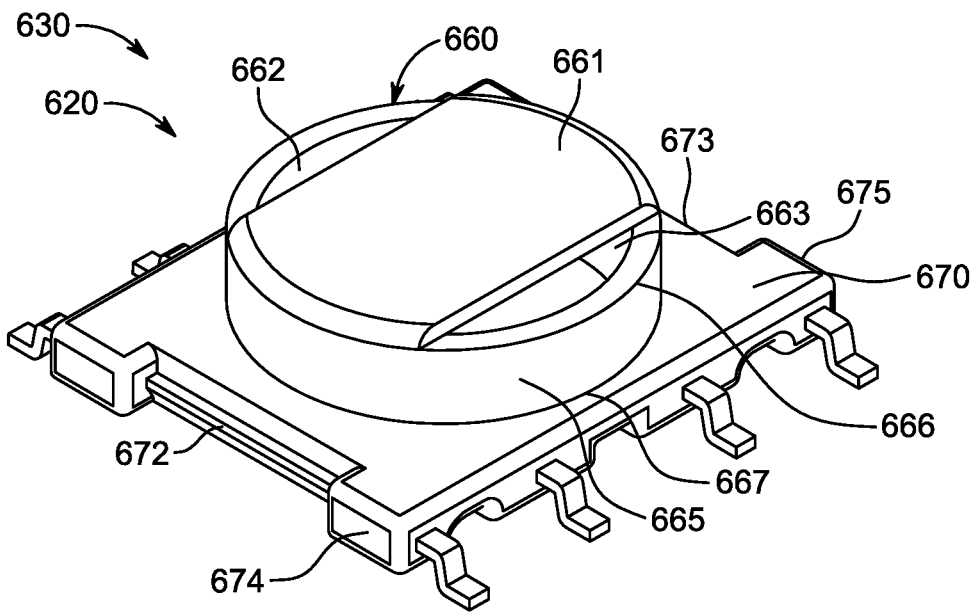
Figure 6C:
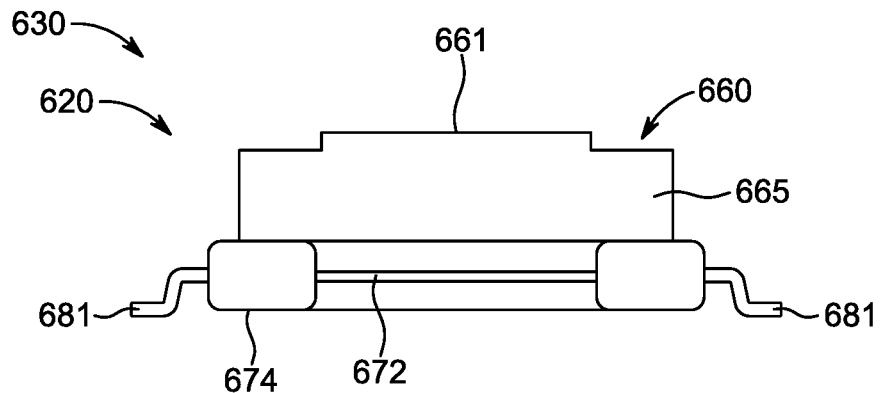
Figure 6D:
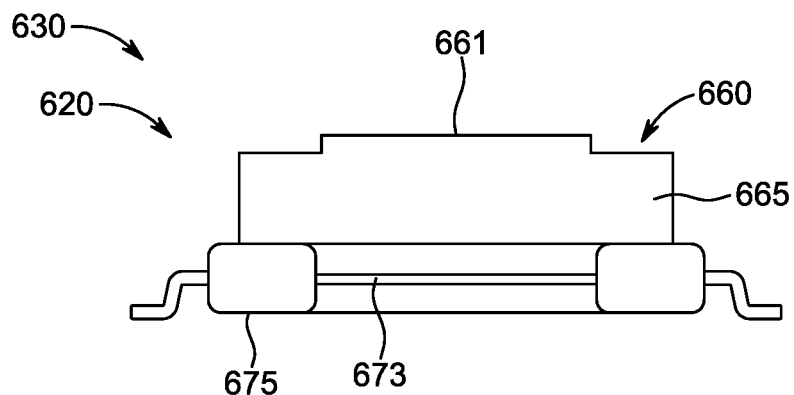
Figure 6E:
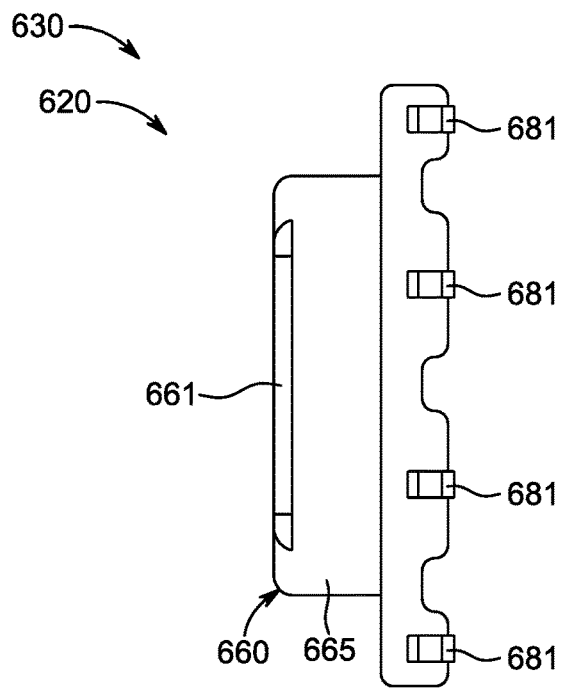
Figure 6F:
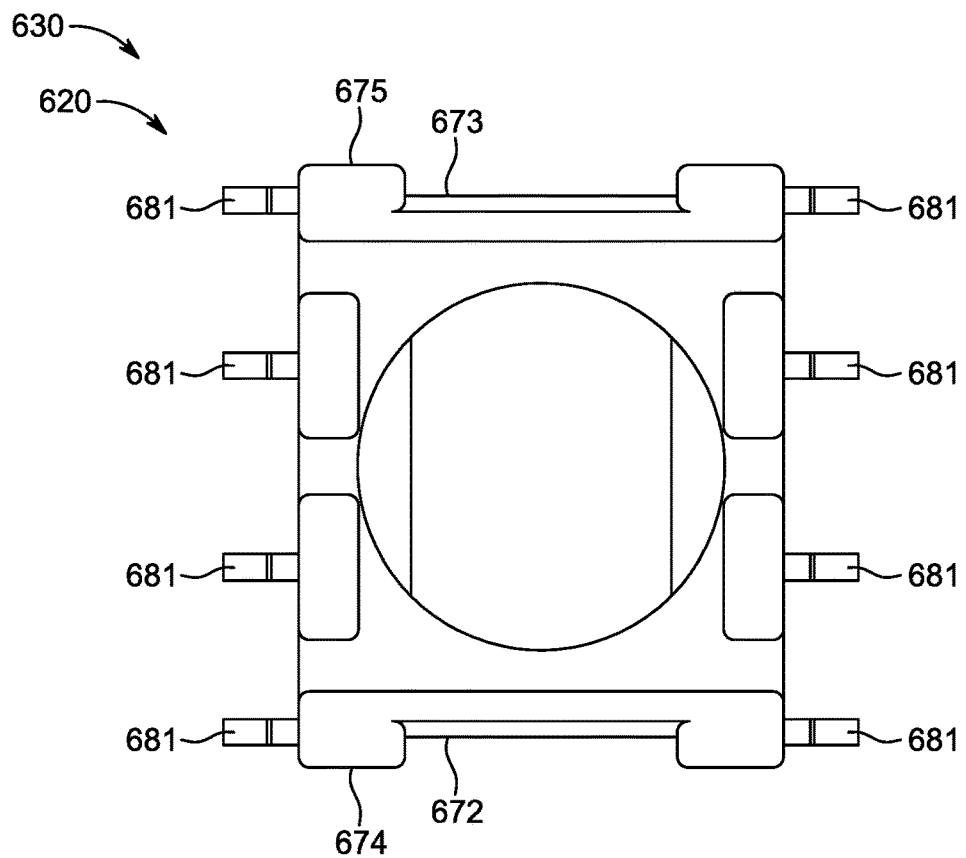
Figure 6G:
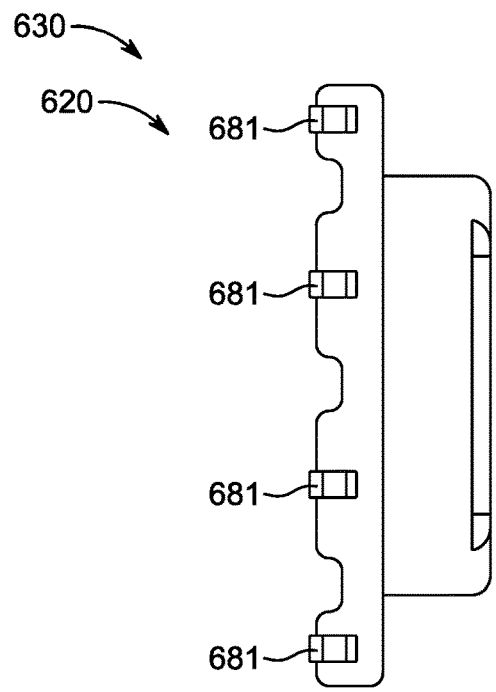
Figure 6H:
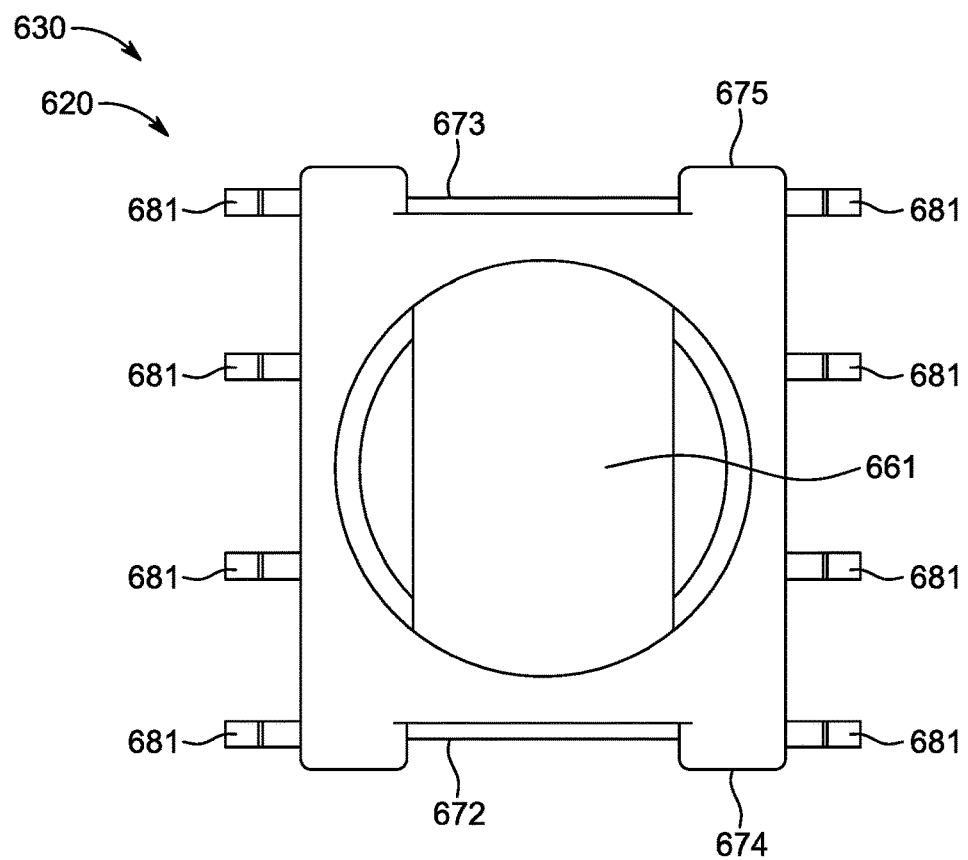
Figure 7A:
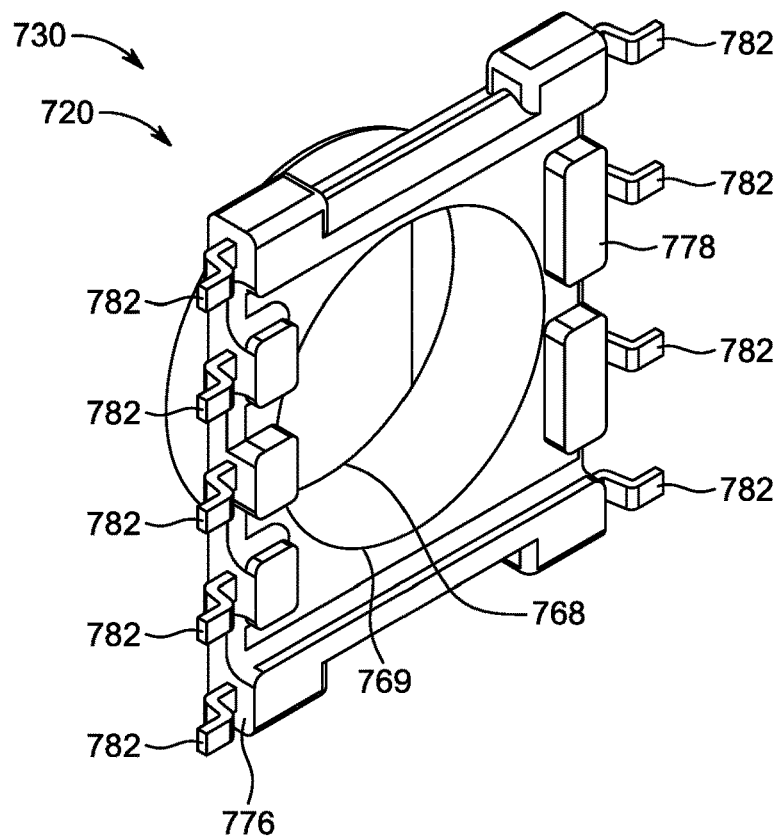
FIGS. 7A-7H illustrate different views of a package, according to a fourth embodiment.
Figure 7B:
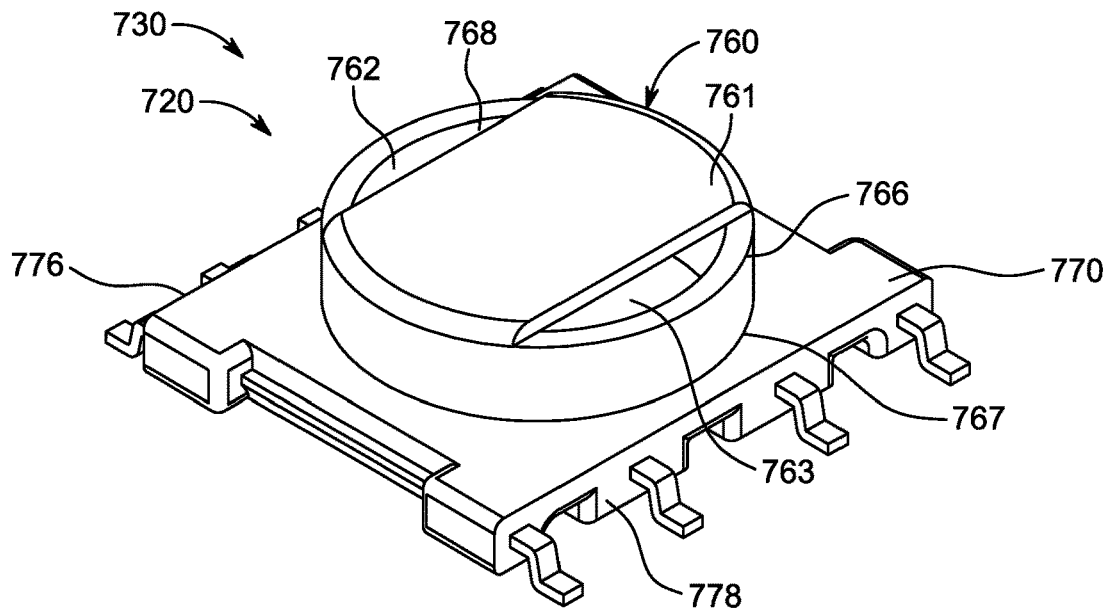
Figure 7C:
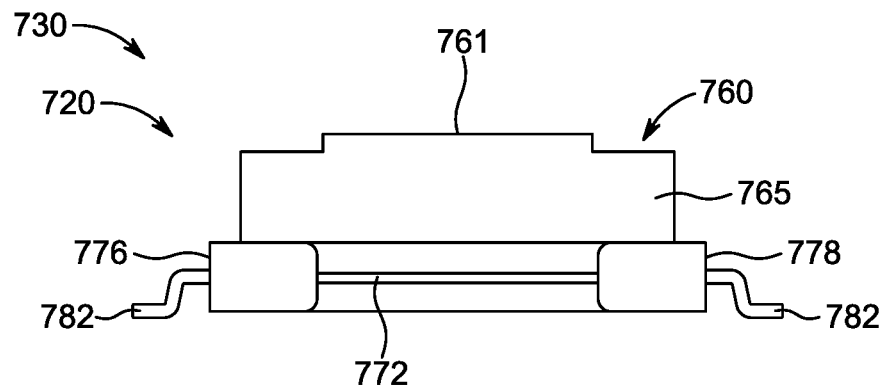
Figure 7D:
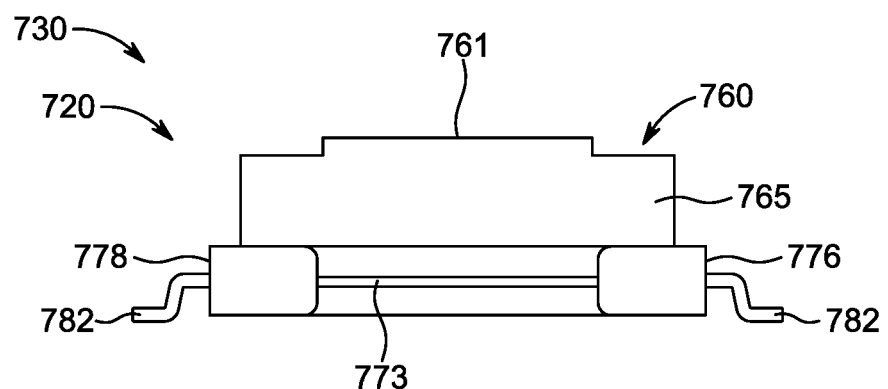
Figure 7E:
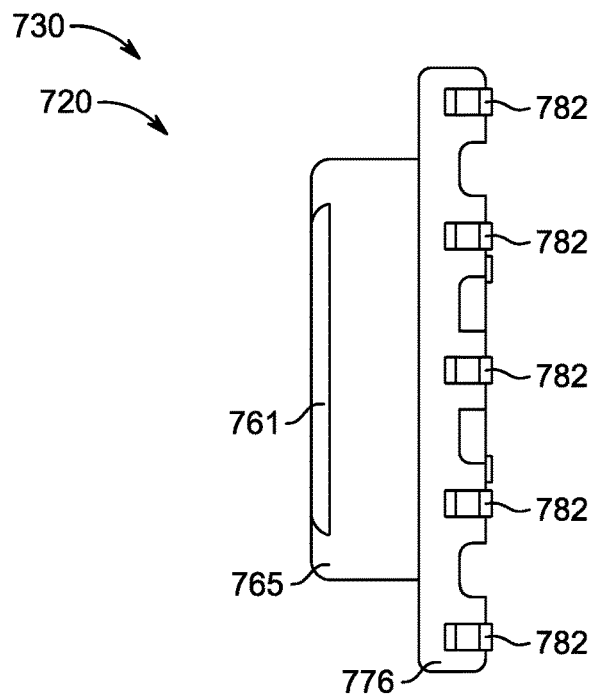
Figure 7F:
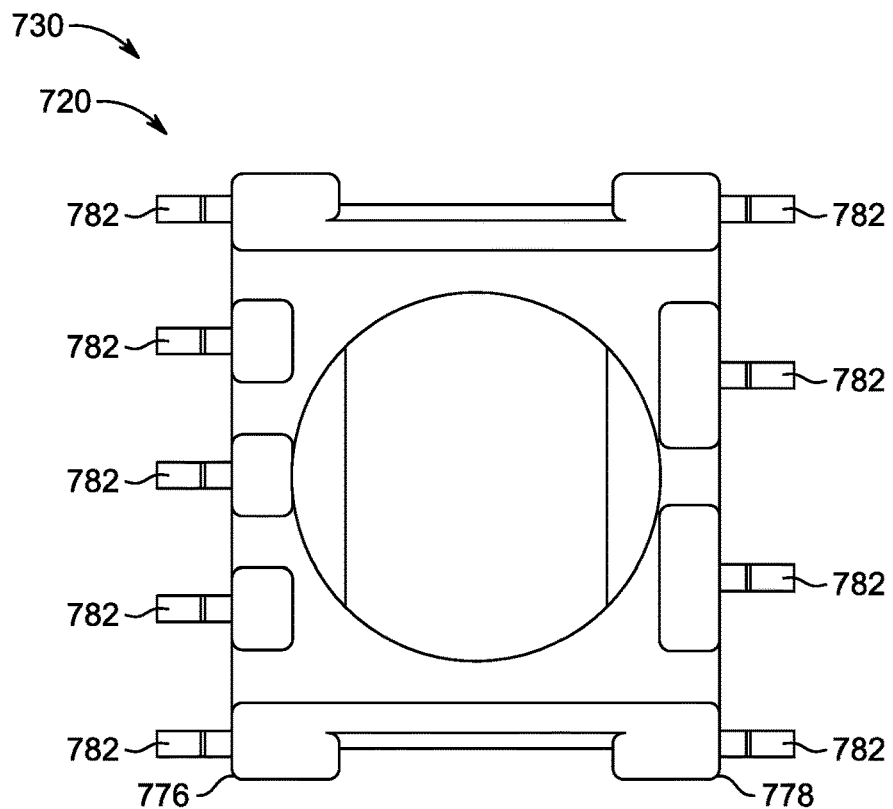
Figure 7G:
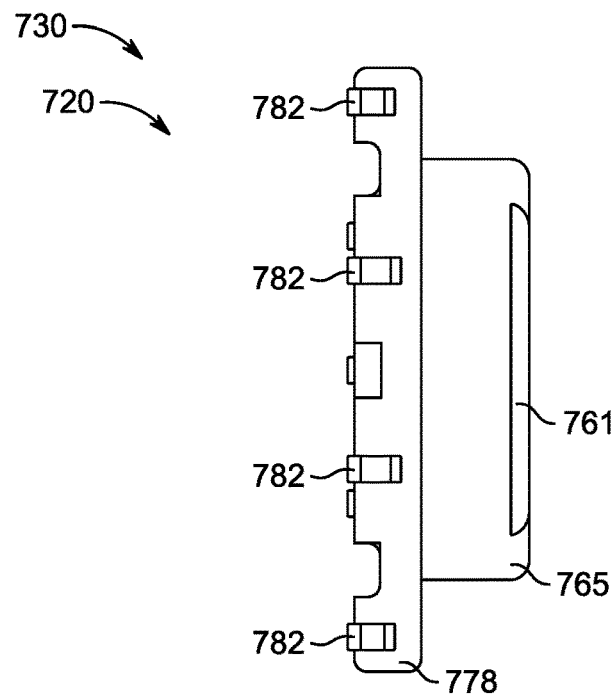
Figure 7H:
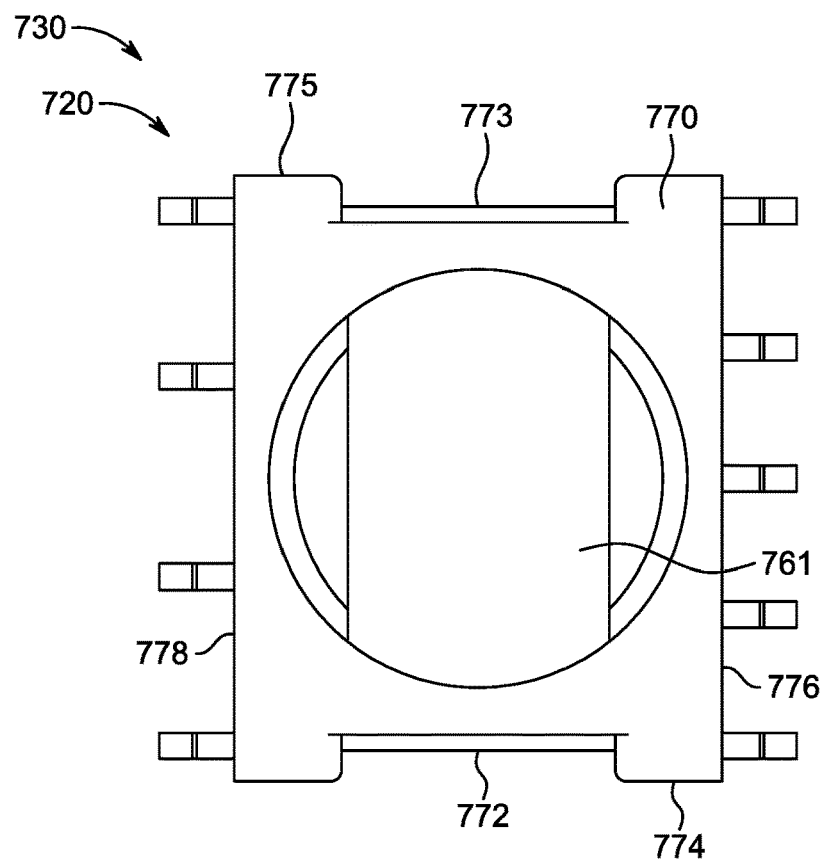
Figure 8A:
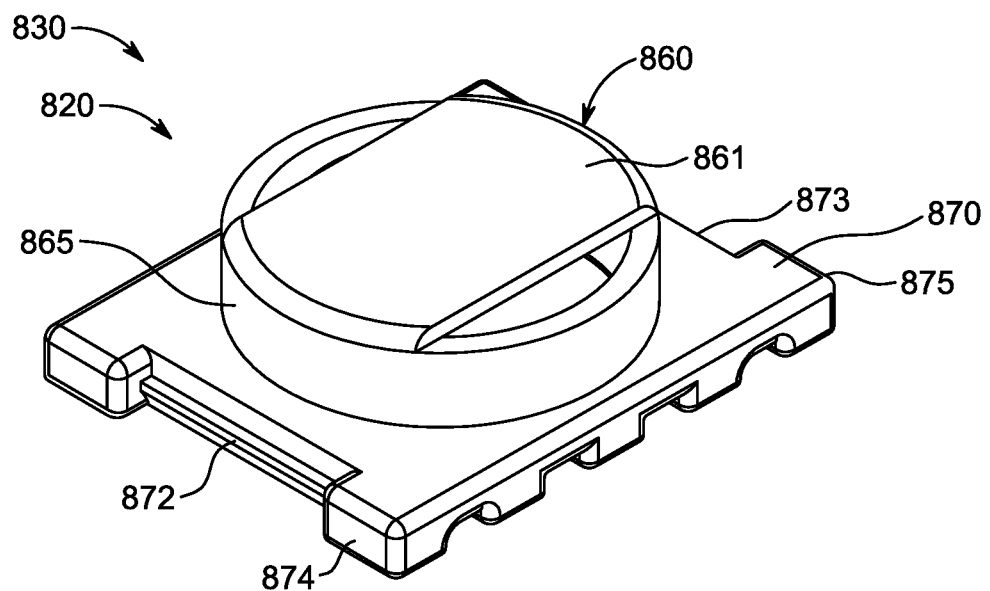
FIGS. 8A-8G illustrate different views of a package, according to a fifth embodiment.
Figure 8B:
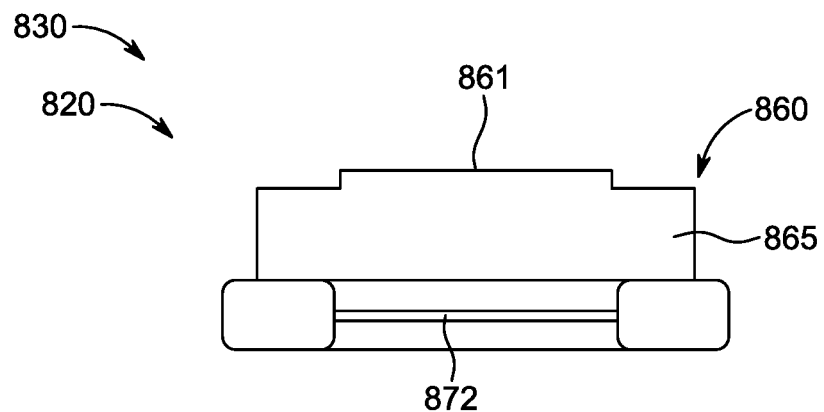
Figure 8C:
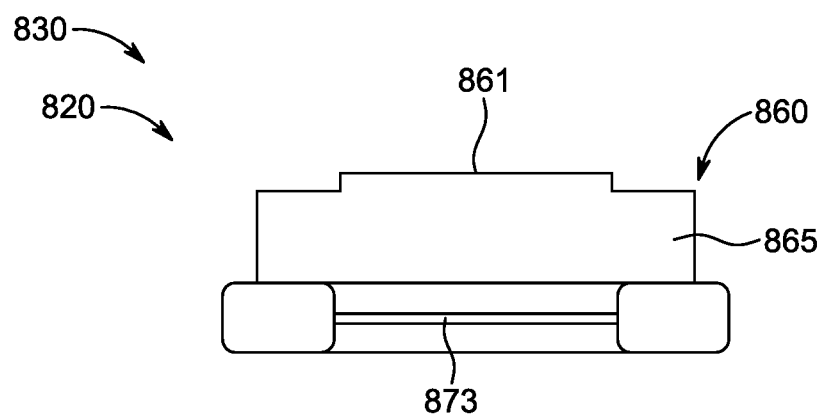
Figure 8D:
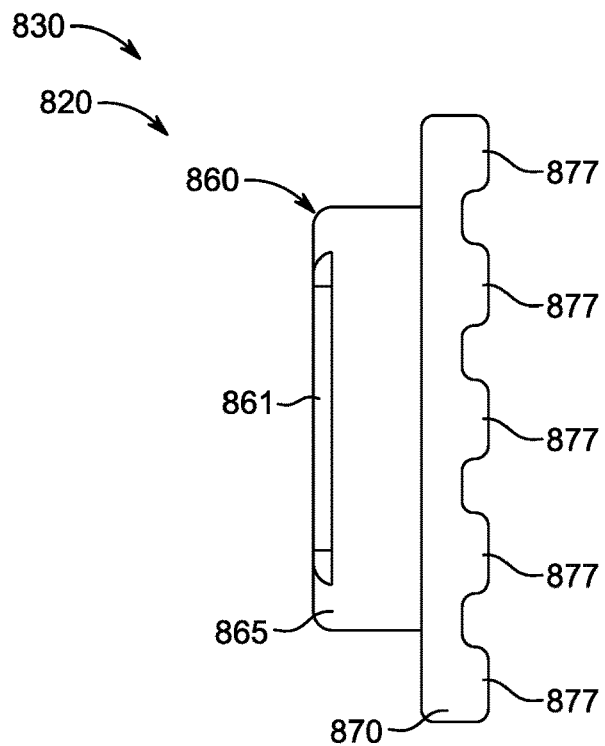
Figure 8E:
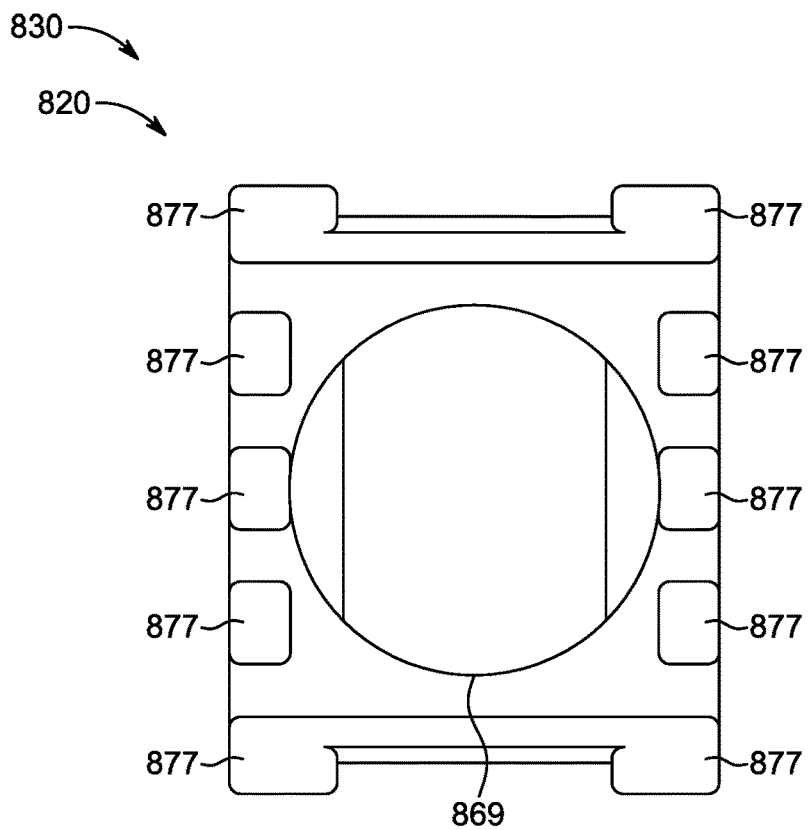
Figure 8F:
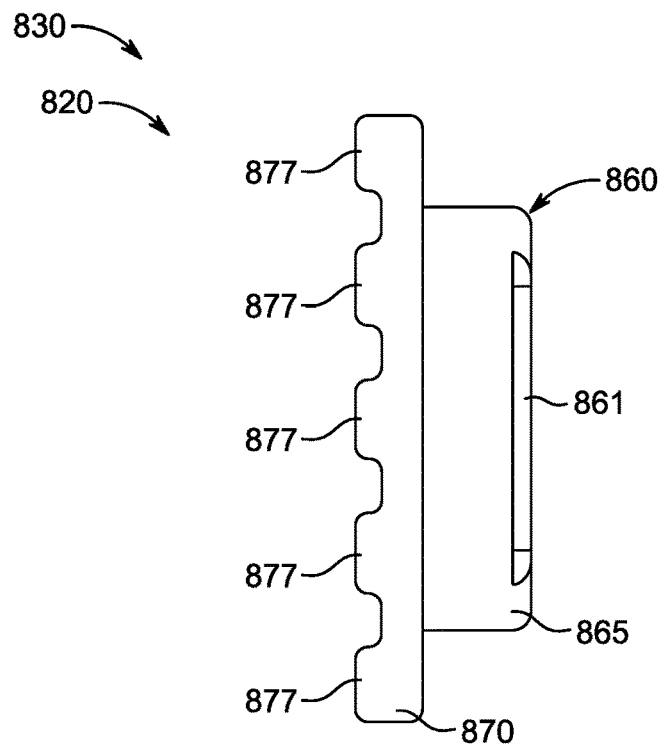
Figure 8G:
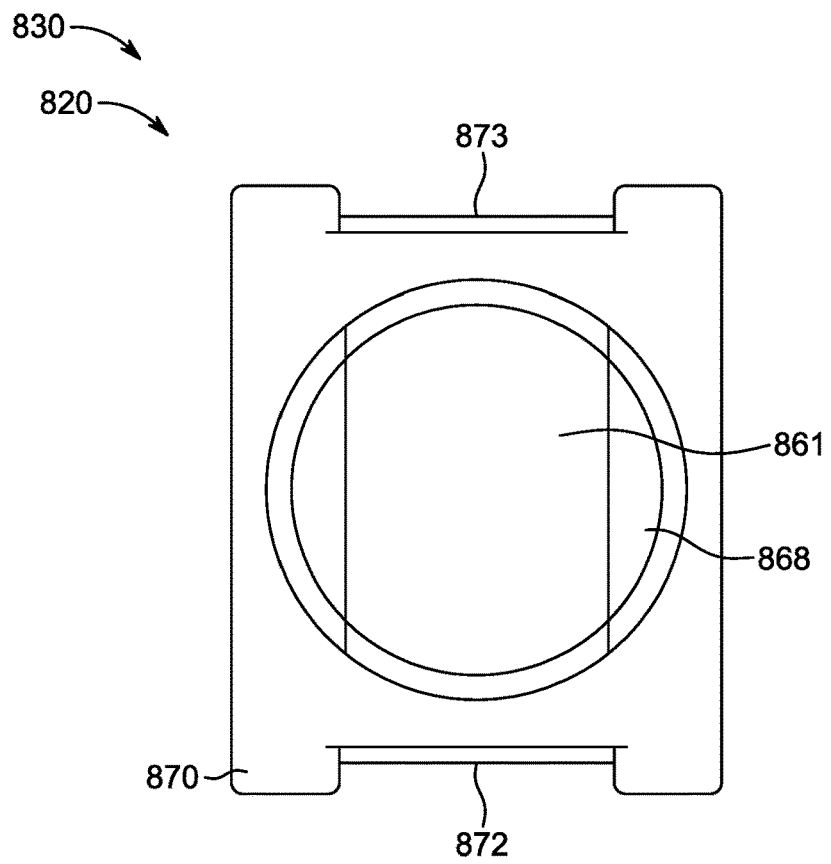
Figure 9A:
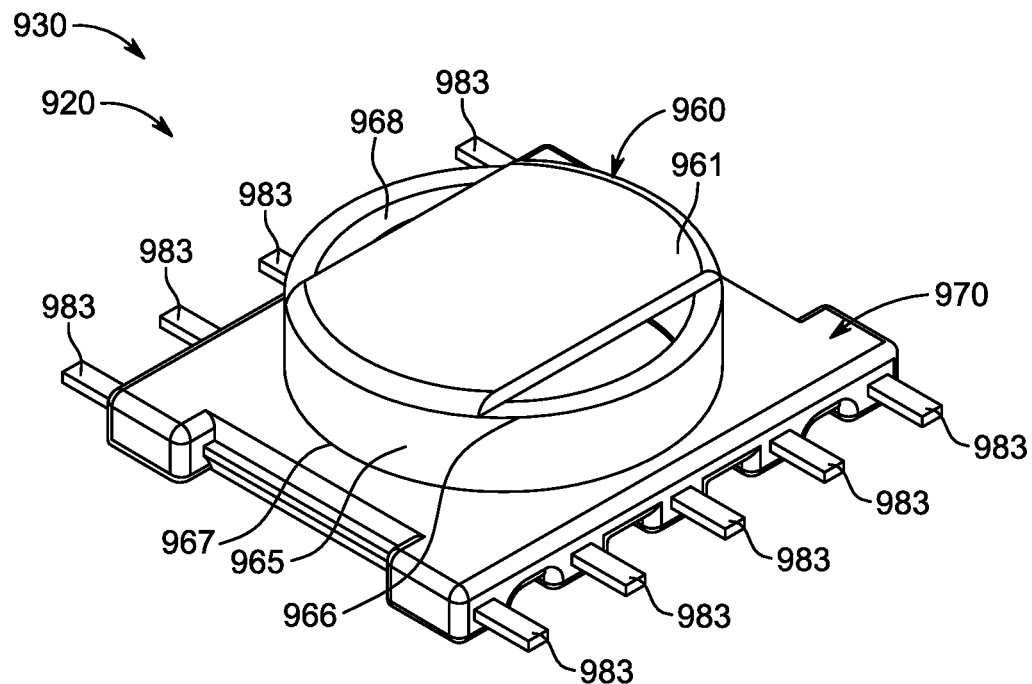
FIGS. 9A-9F illustrate different views of a package, according to a sixth embodiment.
Figure 9B:
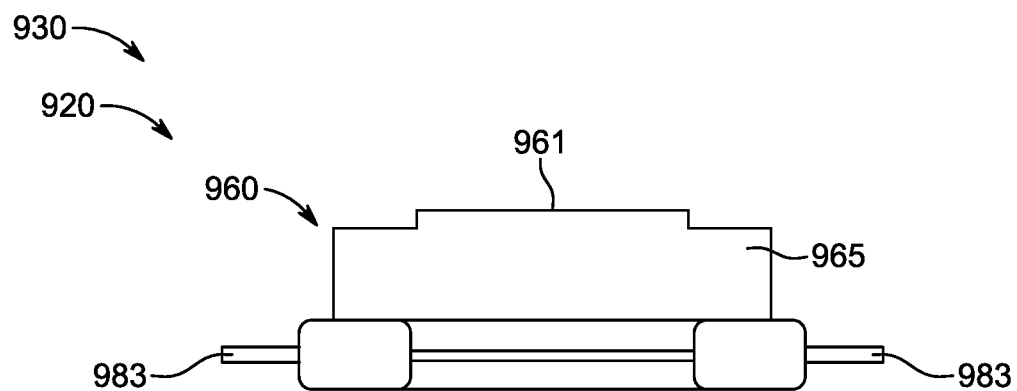
Figure 9C:
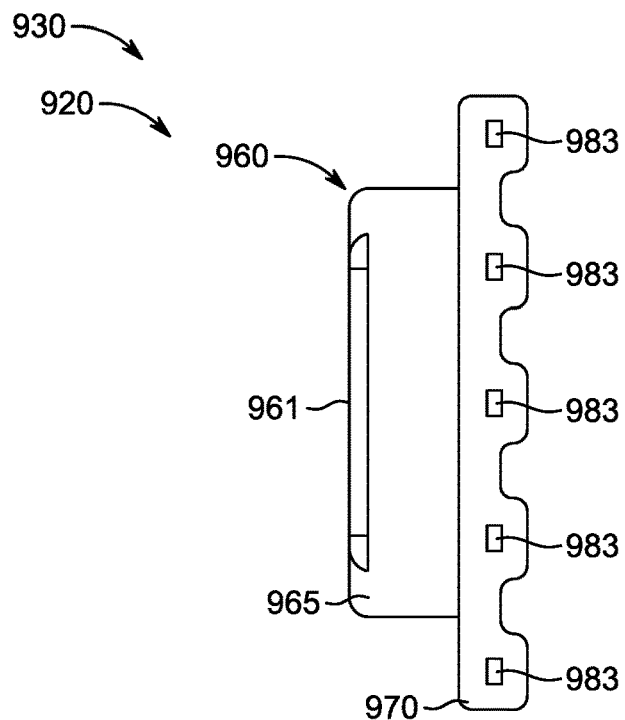
Figure 9D:
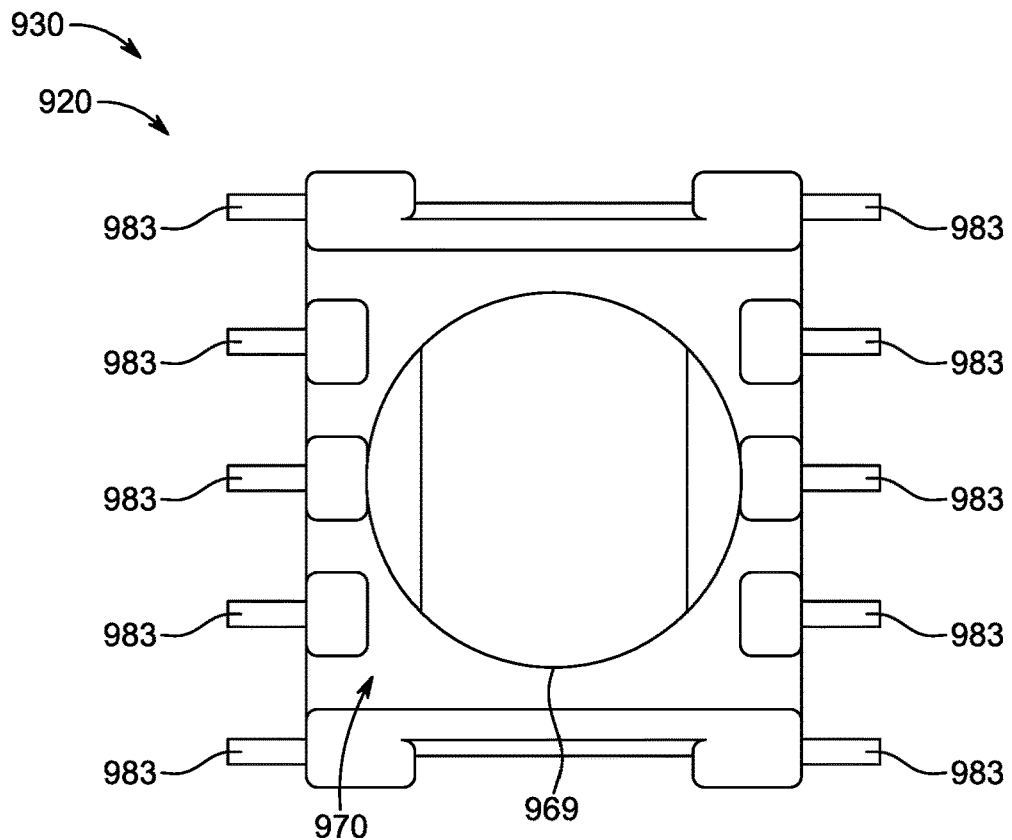
Figure 9E:
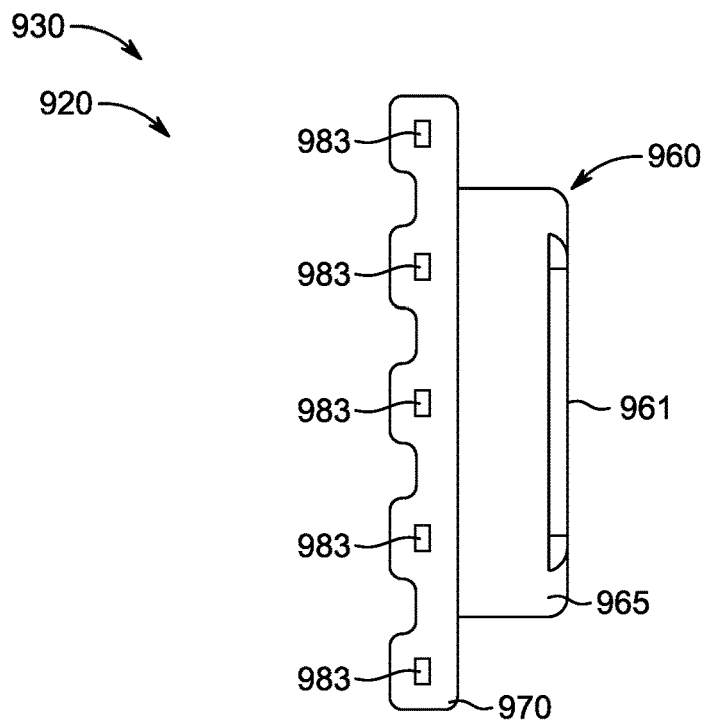
Figure 9F:
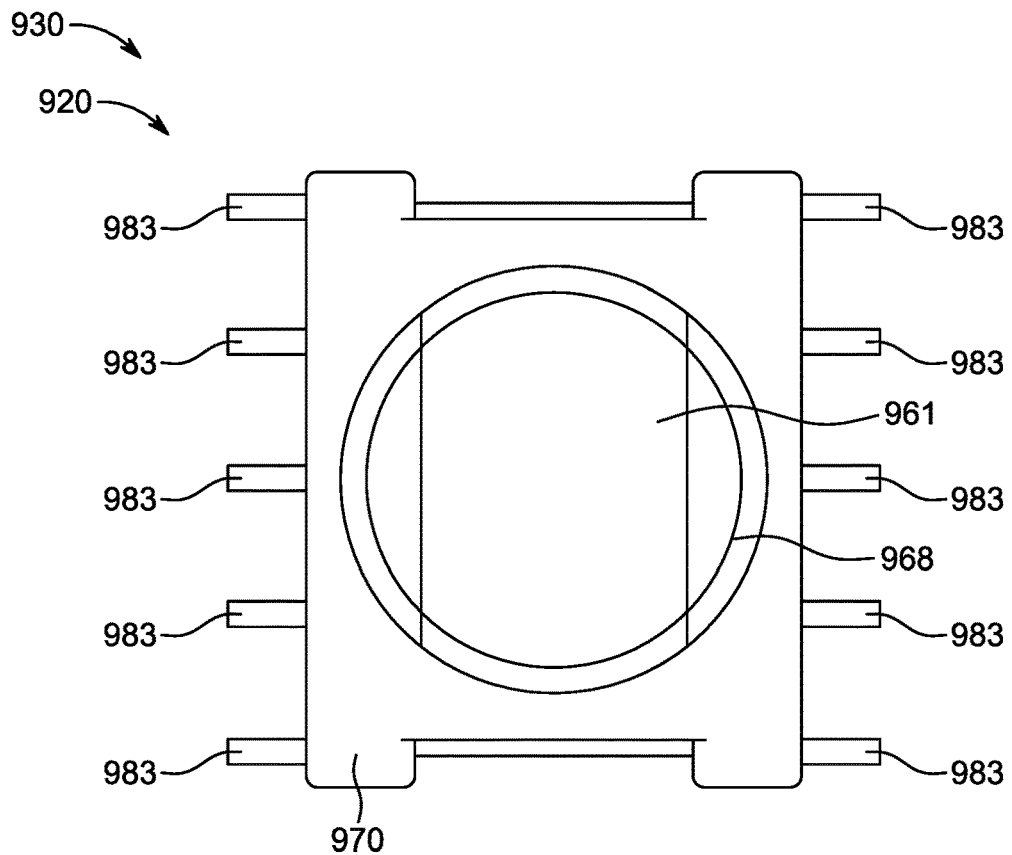
Figure 10A:
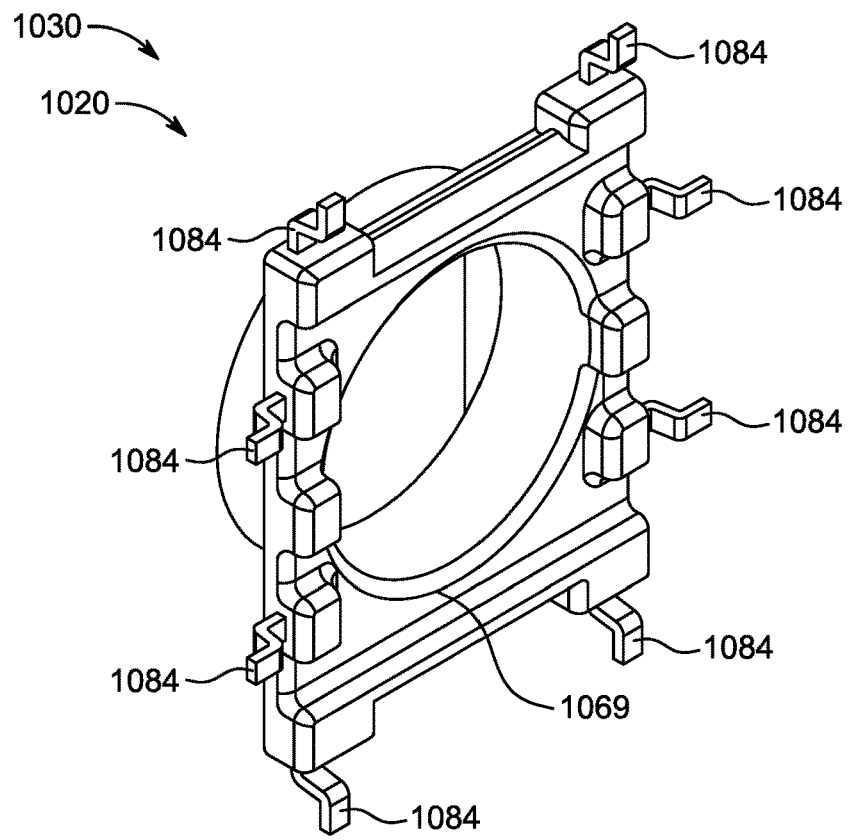
FIGS. 10A-10H illustrate different views of a package, according to a seventh embodiment.
Figure 10B:
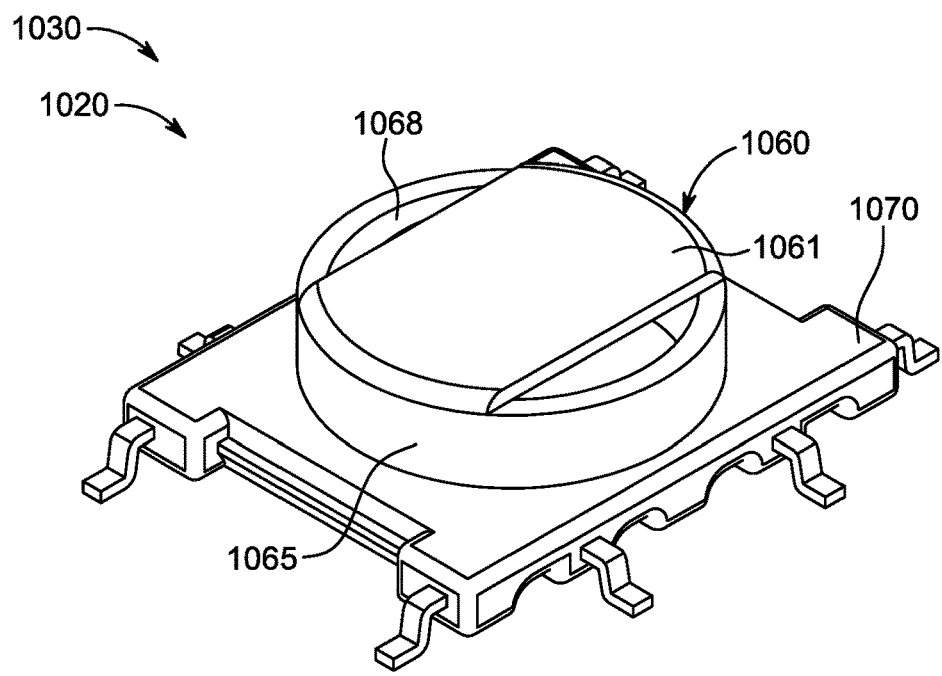
Figure 10C:
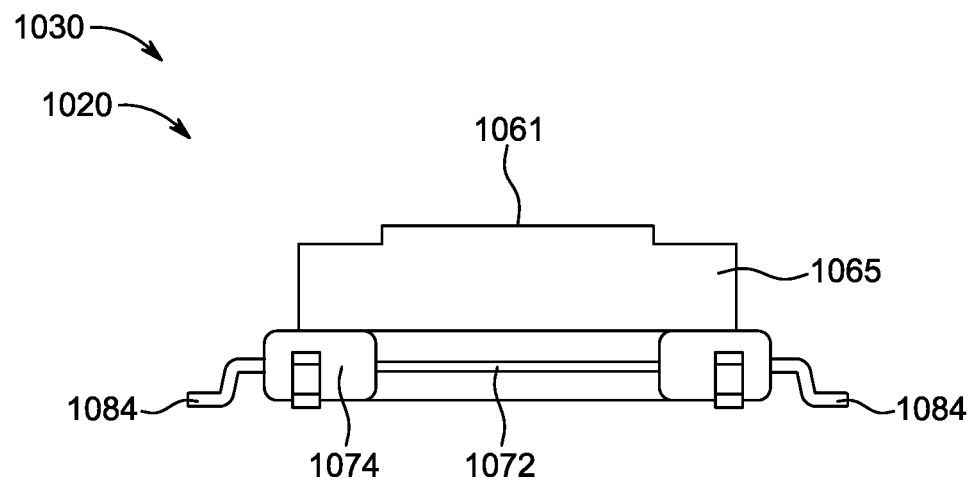
Figure 10D:
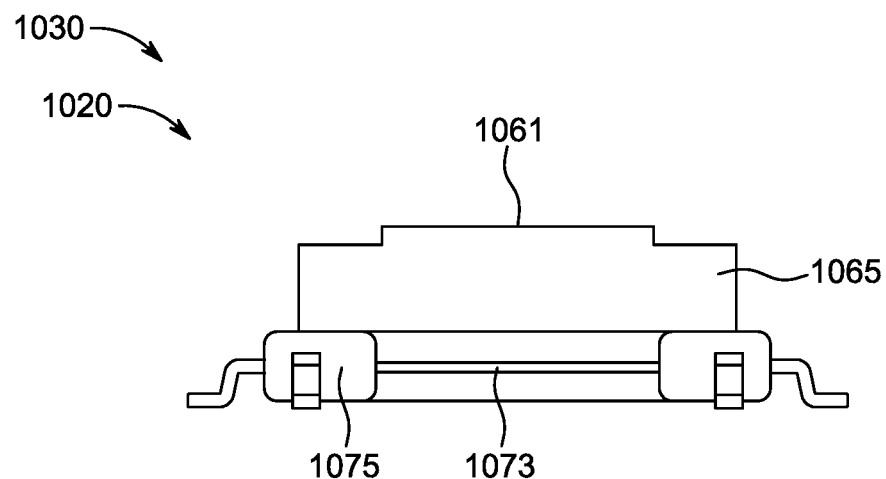
Figure 10E:
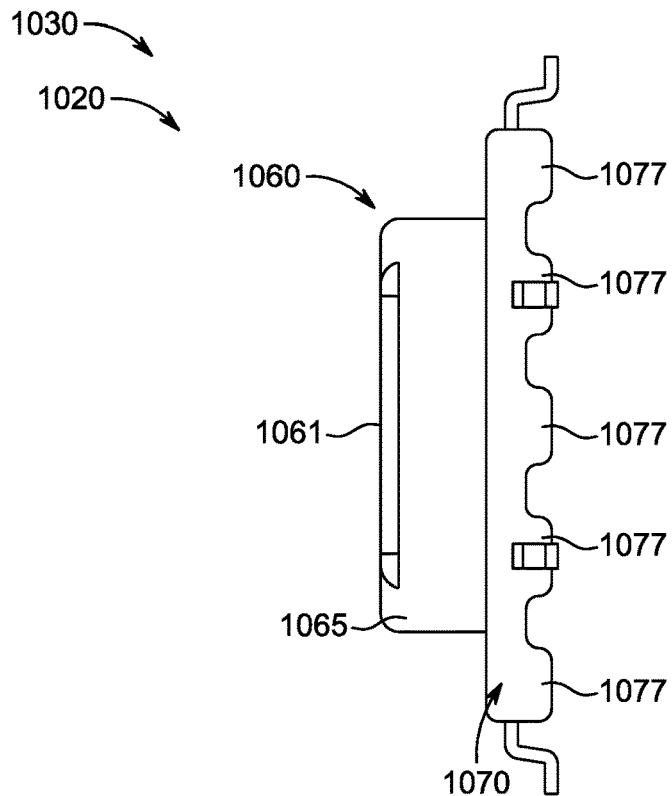
Figure 10F:
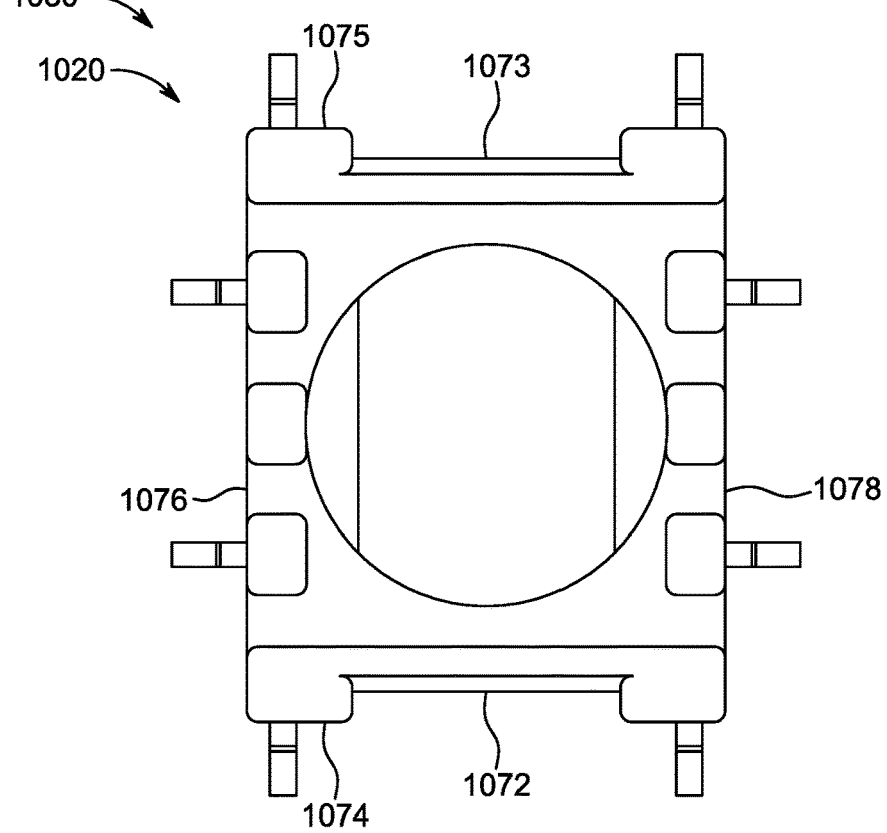
Figure 10G:
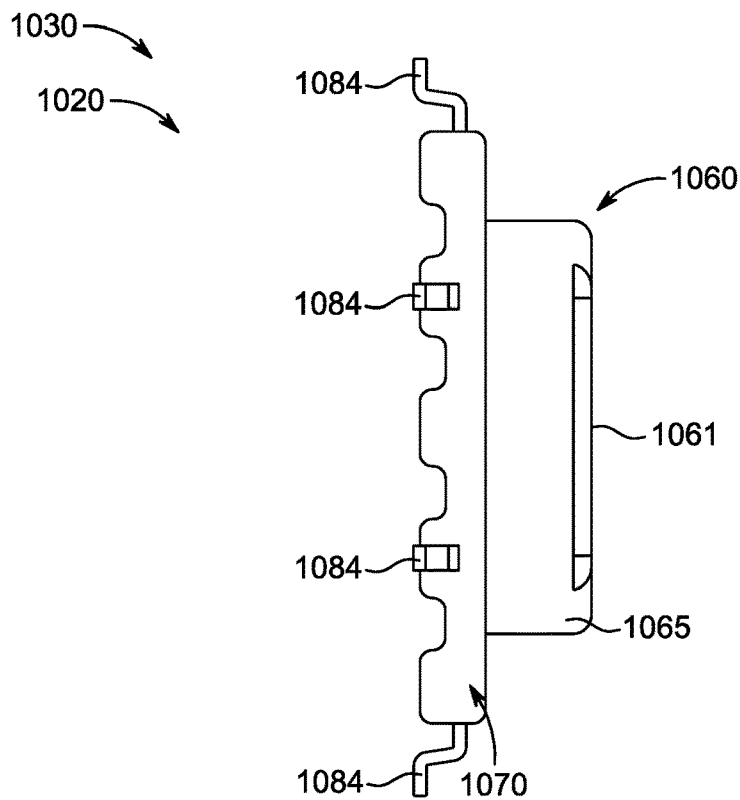
Figure 10H:
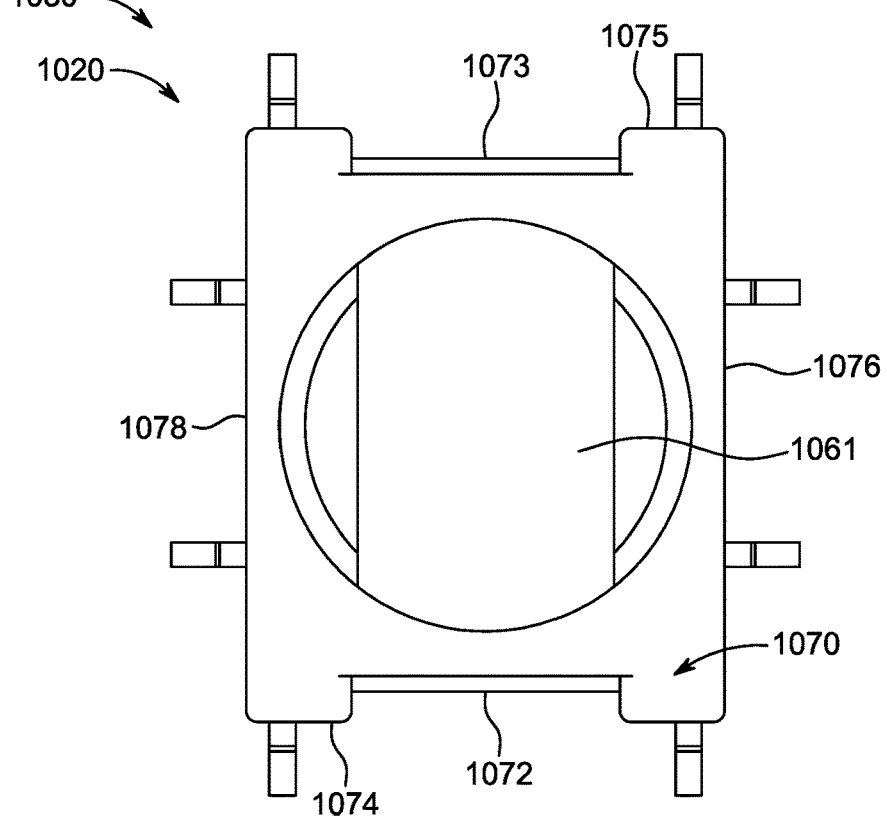
Figure 11A:
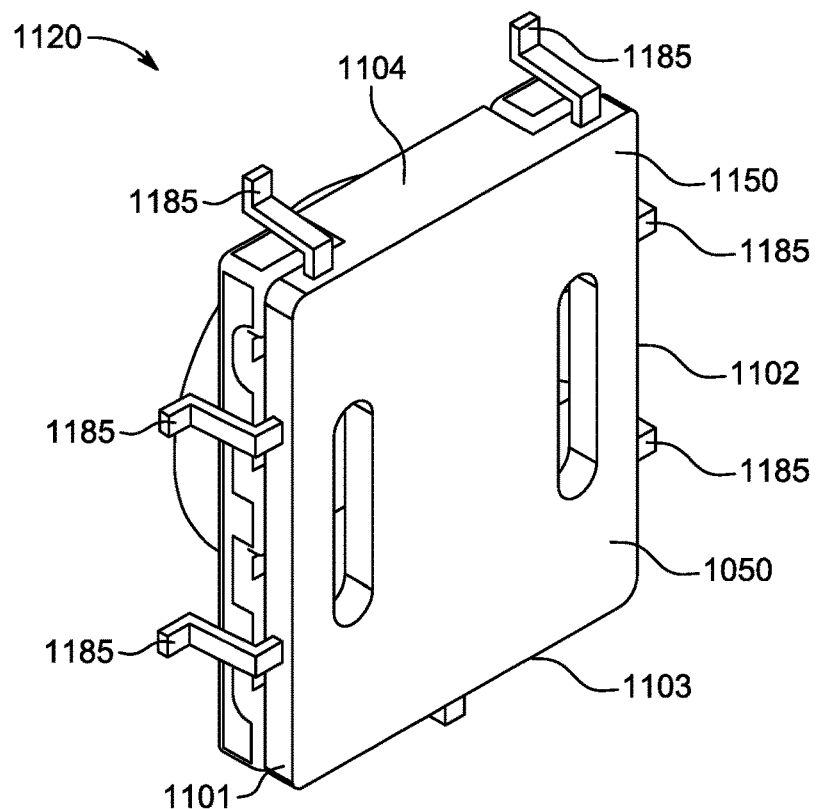
FIGS. 11A-11H illustrate different views of a package, according to an eighth embodiment.
Figure 11B:
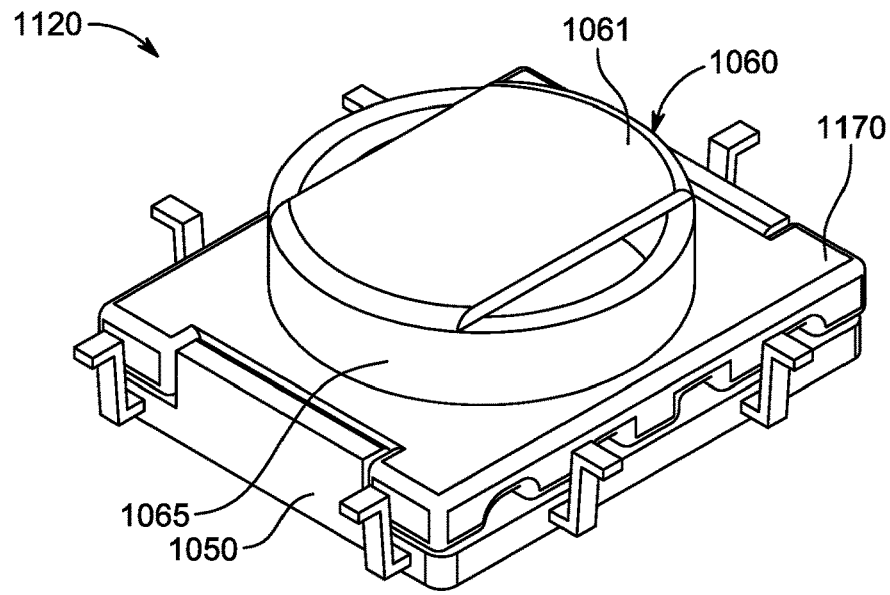
Figure 11C:
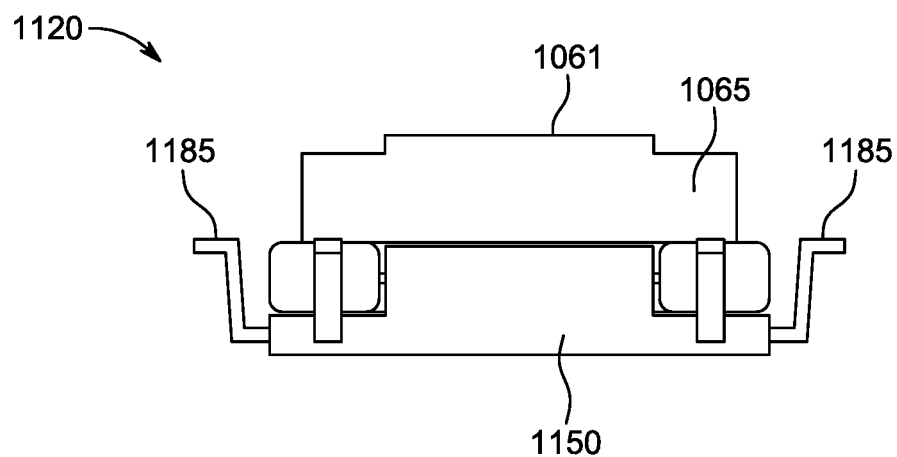
Figure 11D:
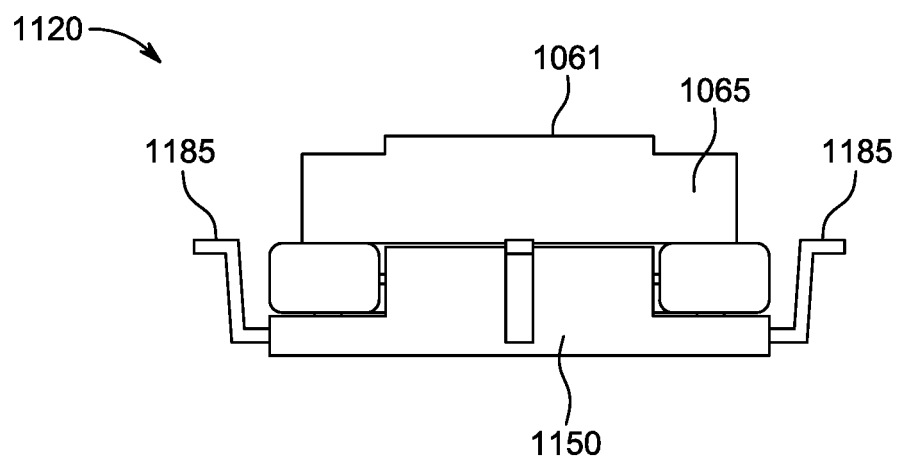
Figure 11E:
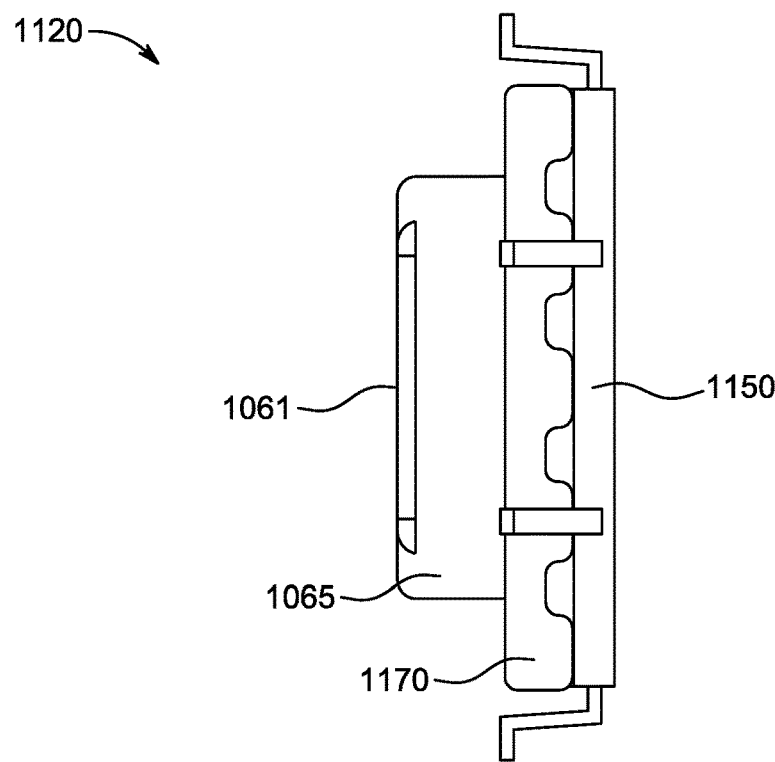
Figure 11F:
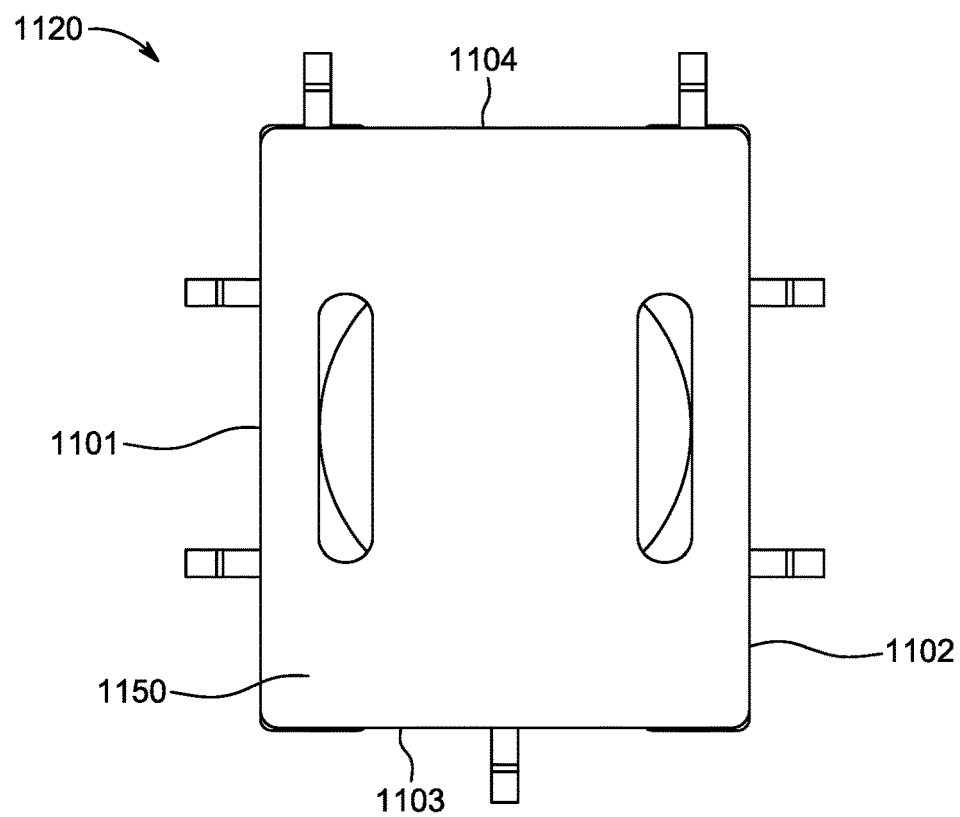
Figure 11G:
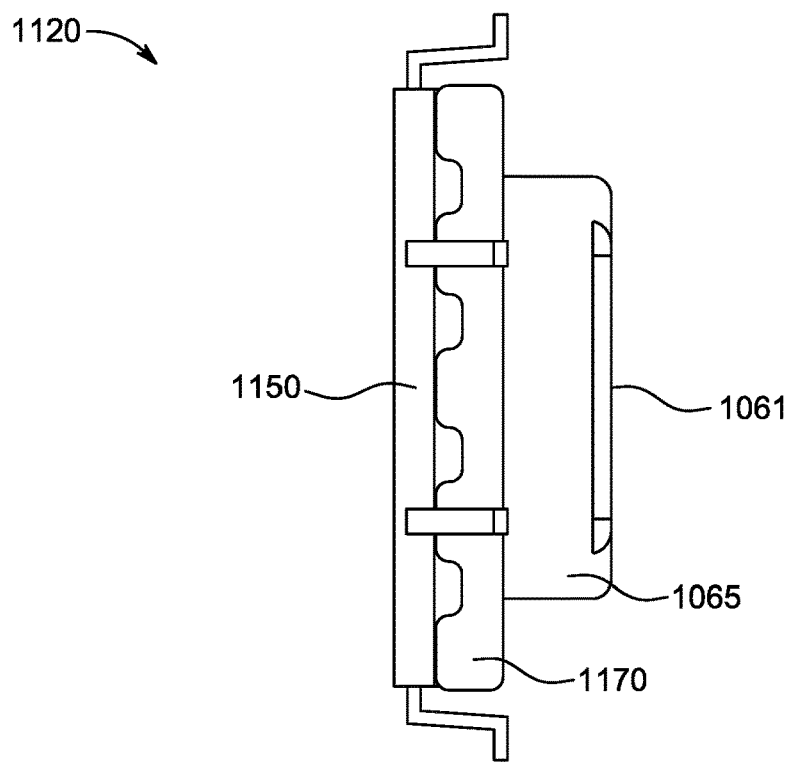
Figure 11H:
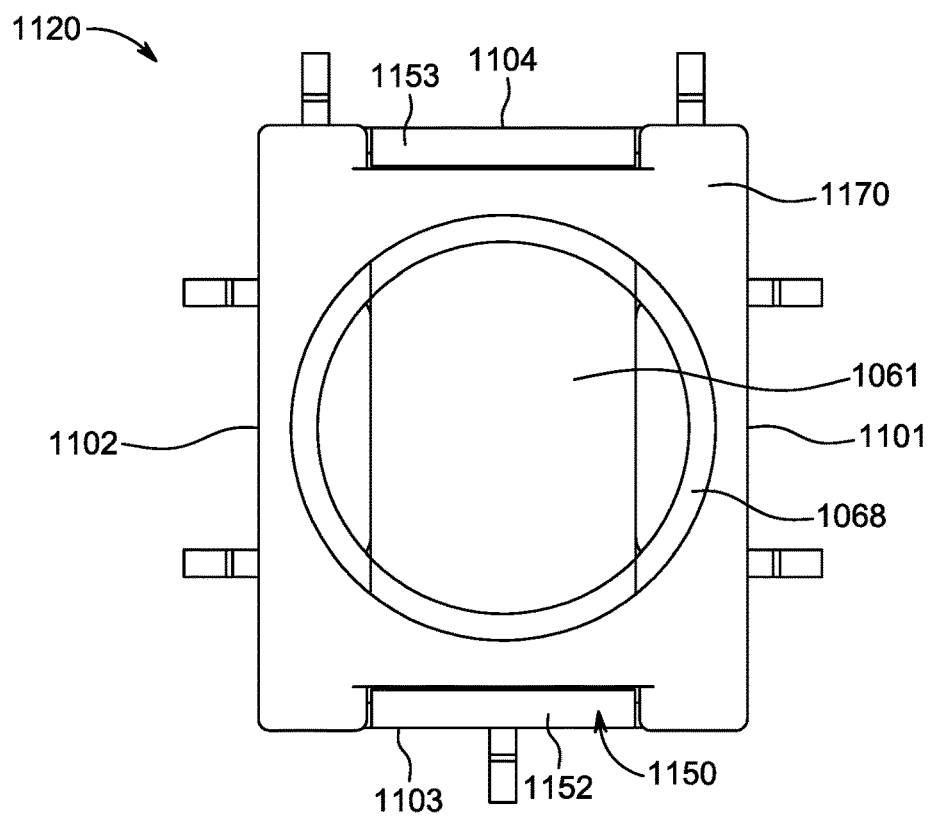
Figure 12A:
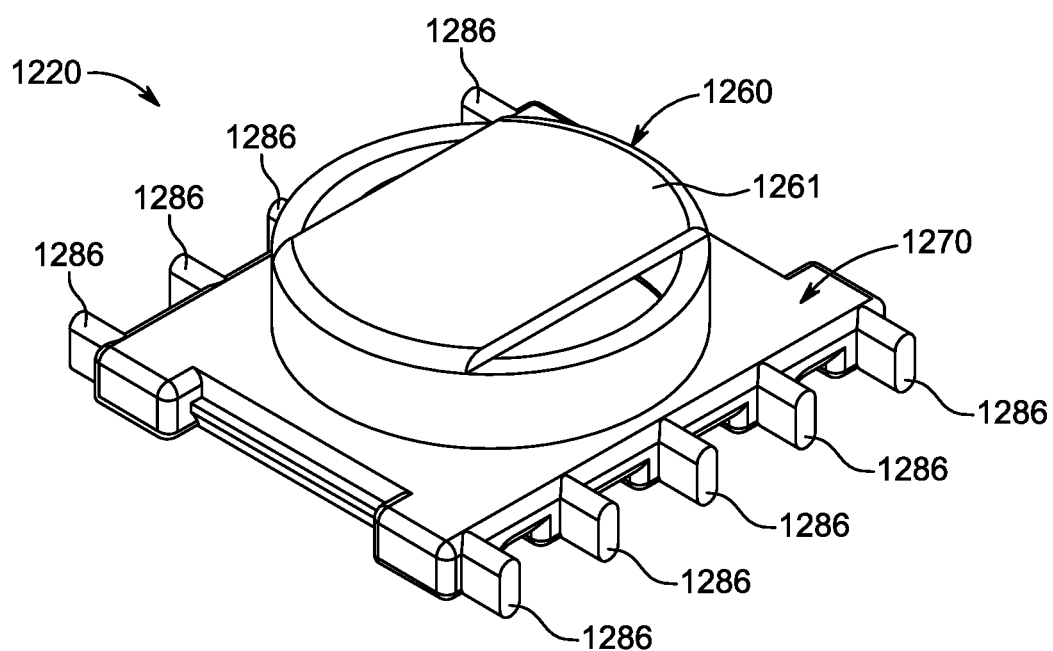
FIGS. 12A-12G illustrate different views of a package, according to a ninth embodiment.
Figure 12B:
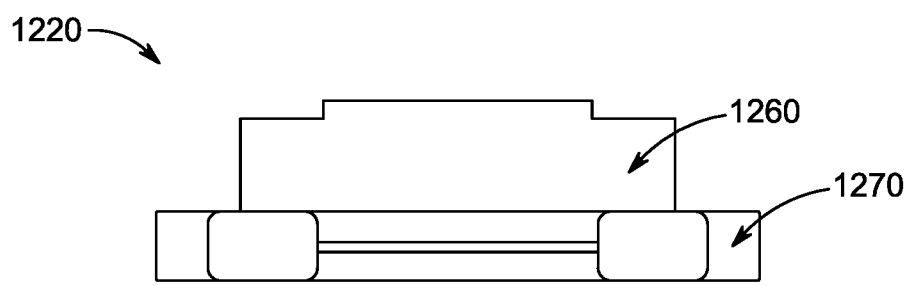
Figure 12C:
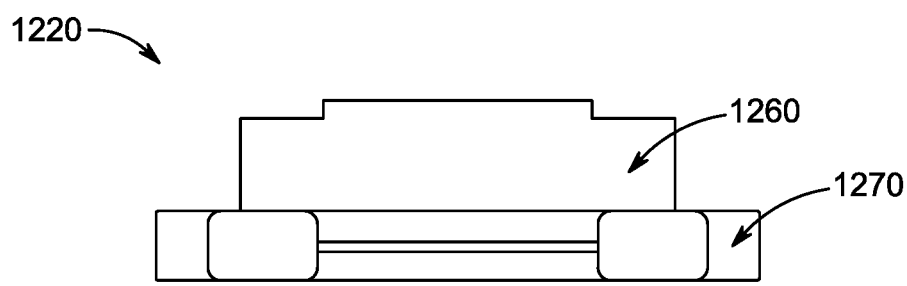
Figure 12D:
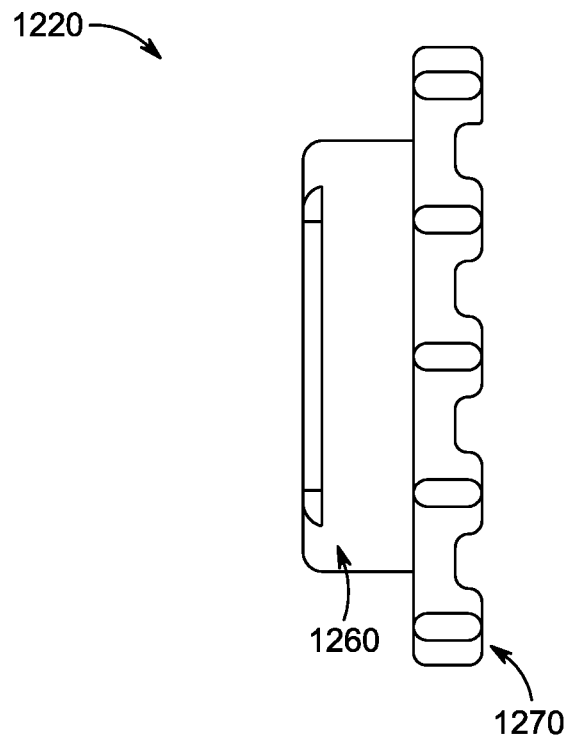
Figure 12E:
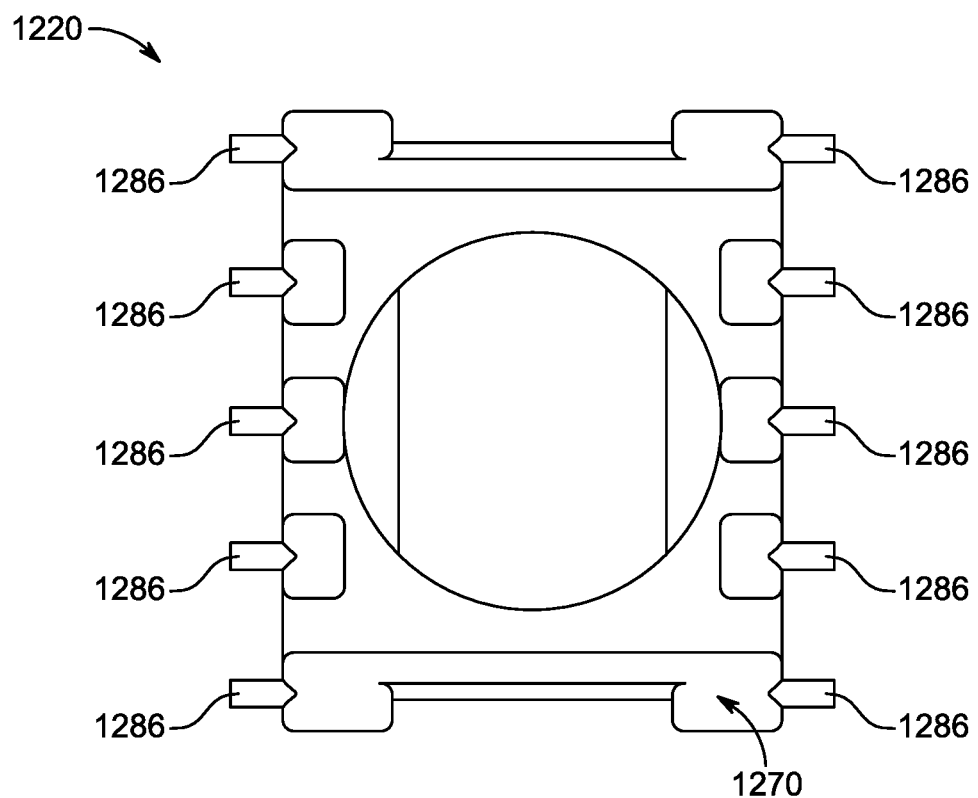
Figure 12F:
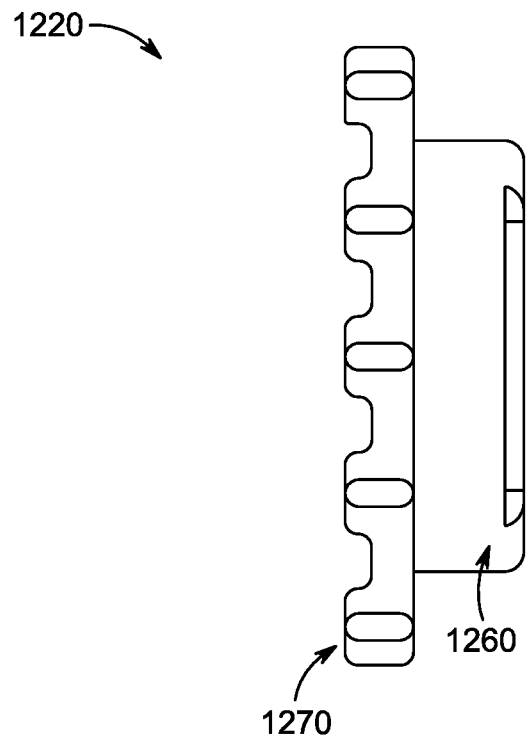
Figure 12G:
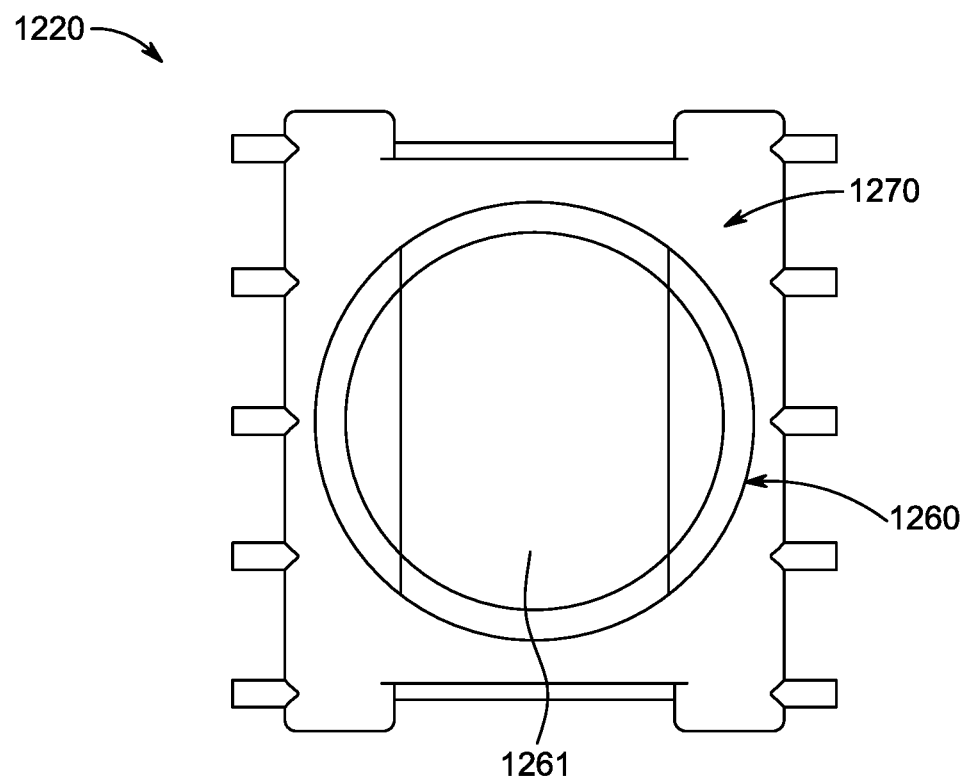

FIGS. 5A-5J illustrate different views of an electric circuit system 500, according to a second embodiment. FIG. 5A is an exploded view of the electric circuit system 500. The electric circuit system 500 is similar to the electric circuit system 100 shown in FIG. 1A. Differences between the electric circuit system 500 from the electric circuit system 100 are described below.

In some embodiments, the package 520 in the electric circuit system 500 does not have a cap. It will be appreciated that the package 520 can have a cap. In some embodiments, the plurality of terminals 579 is similar to the plurality of terminals 179 in FIGS. 3A-3H.

FIGS. 5B-5J are different views of the electric circuit system 500. The package 520 and the circuit board 510 are similar to the package 120 and the circuit board 110 in FIGS. 1B-1J. Differences between the package 520 and the circuit board 510 from the package 120 and the circuit board 110 are described below.

In this embodiment, the package 520 does not have a cap and is configured to be placed on the circuit board 510 such that the package 520 does not pass through the circuit board 510. Accordingly, a cap (such as the cap 150 shown in FIGS. 1A-1J) is not necessary. It will be appreciated that an electric (or electronic) component 540 can be housed within the package 520.

In this embodiment, a plurality of pads 512 are disposed on the first side 513 of the circuit board 510, and a plurality of pads (not shown) can be disposed on the second side 514 of the circuit board 510. The base 570, the support portion 565 of the header 560, and the top portion 561 of the header 560 are located on the second side 514 of the circuit board 510. It will be appreciated that the base 570, the support portion 565 of the header 560, and the top portion 561 of the header 560 can be located on the first side 513. The hole 511 of the circuit board 510 substantially aligns with the cavity of the base 570 and the first and second openings of the support portion 565 of the header 560. This embodiment can allow the package 520 to be used, for example, without a cap and/or to not be mounted through the circuit board 510.

FIGS. 6A-6H illustrate different views of a package 620, according to a third embodiment. The package 620 is similar to the package 120 shown in FIGS. 3A-3H. Differences between the package 620 from the package 120 are described below. While not shown, it will be appreciated that an electric (or electronic) component can be housed within the package 620.

In this embodiment, the number of terminals 681 is less than the number of terminals 179 in FIGS. 3A-3H. In particular, the package 620 includes four terminals 681 on each side of opposing sides of the package 620. It will be appreciated that the number and type of terminals in any one of the variations of terminals described in this disclosure can vary, depending on different applications.

FIGS. 7A-7H illustrate different views of a package 720, according to a fourth embodiment. The package 720 is similar to the package 120 shown in FIGS. 3A-3H. Differences between the package 720 from the package 120 are described below. While not shown, it will be appreciated that an electric (or electronic) component can be housed within the package 720.

In this embodiment, the number of terminals 782 on the third edge 776 of the base 770 is more than the number of terminals 782 on the fourth edge 778 of the base 770. The locations of the terminals 782 on the third edge 776 of the base 770 and the locations of terminals 782 on the fourth edge 778 of the base 770 are asymmetric. It will be appreciated that the number and type of terminals on any edge of the base in any one of the variations of terminals described in this disclosure can vary, depending on different applications.

FIGS. 8A-8G illustrate different views of a package 820, according to a fifth embodiment. The package 820 is similar to the package 120 shown in FIGS. 3A-3H. Differences between the package 820 from the package 120 are described below. While not shown, it will be appreciated that an electric (or electronic) component can be housed within the package 820. In this embodiment, the package 820 does not have any terminals. In some embodiments, wires of the electric or electronic component can protrude out of the package 820 without connecting to a terminal. These wires are typically referred to as "flying leads". This embodiment can allow cheaper mold tooling that uses less manufacturing steps and lower material costs.

FIGS. 9A-9F illustrate different views of a package 920, according to a sixth embodiment. The package 920 is similar to the package 120 shown in FIGS. 3A-3H. Differences between the package 920 from the package 120 are described below. While not shown, it will be appreciated that an electric (or electronic) component can be housed within the package 920.

In this embodiment, each one of a plurality of terminals 983 includes only one segment extending from the base 970 in a direction parallel to an outer surface of the top portion 961.

FIGS. 10A-10H illustrate different views of a package 1020, according to a seventh embodiment. The package 1020 is similar to the package 120 shown in FIGS. 3A-3H. Differences between the package 1020 from the package 120 are described below. While not shown, it will be appreciated that an electric (or electronic) component can be housed within the package 1020.

In this embodiment, a plurality of terminals 1084 is located on all four edges 1074, 1075, 1076, and 1078 of the base 1070. A first rail 1072 is located on the first edge 1074. A second rail 1073 is located on the second edge 1075. When the terminals 1084 are located on the first edge 1074, the terminals 1084 are located on a protruded area that is not part of the first rail 1072. When the terminals 1084 are located on the second edge 1075, the terminals 1084 are located on a protruded area that is not part of the second rail 1073.

In some embodiments, the number of sections 1077 can be larger than the number of terminals 1084. It will be appreciated that in some embodiments, one or more of the sections 1077 may not have terminals 1084 on them.

FIGS. 11A-11H illustrate different views of a package 1120, according to an eighth embodiment. The package 1120 is similar to the package 1020 shown in FIGS. 10A-10H. Differences between the package 1120 from the package 1020 are described below.

In this embodiment, the package 1120 includes a cap 1150. In this embodiment, there are no terminals on the base 1170. Also, in this embodiment, a plurality of terminals 1185 are located on all four edges 1101, 1102, 1103, and 1104 of the cap 1150. The number and type of the terminals 1185 on each edge of the cap 1150 can vary, depending on different applications. The location of the terminals 1185 on each edge of the cap 1150 can vary, depending on different applications. In some embodiments, the terminals 1185 can be located in an area outside of the protruding portions 1152, 1153 on an edge that has the protruding portion 1152, 1153.

FIGS. 12A-12G illustrate different views of a package 1120, according to an ninth embodiment. The package 1220 is similar to the package 920 shown in FIGS. 9A-9F. Differences between the package 1220 from the package 920 are described below. While not shown, it will be appreciated that an electric (or electronic) component can be housed within the package 1220.

In this embodiment, each one of a plurality of terminals 1286 includes a single segment extending from the base 1270 in a direction parallel to an outer surface of the top portion 1261. The plurality of terminals 1286 can be, for example, plastic terminals. In some embodiments, wires of the electric or electronic component can be wrapped around the plastic terminals. These wraps can then be dipped in, for example, hot solder. The solder joint can function as the electrical connection to a circuit board.

It will be appreciated that any mount disclosed in any one of the embodiments can be combined with or without any cap disclosed in any one of the embodiments to form a package. It will also be appreciated that any package can have an electric or electronic component housed therein or without electric or electronic component housed therein. It will be further appreciated that any one of the variations (such as material, number, shape, location, etc.) of terminals described in any one of the embodiments can be replaced with any other variation described in any one of the embodiments. It will also be appreciated that any package can be mounted on any circuit board disclosed in any one of the embodiments in a way such that the package either passes through the circuit board or is on top/bottom of the circuit board.

Aspects:

It is to be appreciated that any of aspects 1-12 can be combined with any of aspects 13-19.

Aspect 1. A package for housing an electric or electronic component, the package comprising:
a mount, the mount including:
a header that includes a round top portion and a hollow cylindrical support portion; and
a base,
wherein the hollow cylindrical support portion has a first end and a second end, the first end defines a first opening, and the second end defines a second opening,
wherein the round top portion is secured to the first end of the hollow cylindrical support portion, the round top portion covers the first opening, and the round top portion includes a header vent to allow a substance to flow into and out of an interior of the hollow cylindrical support portion,
wherein the header is configured to house the electric or electronic component therein,
wherein the base is secured to the second end of the hollow cylindrical support portion, the base has a cavity, the base includes at least one terminal that electrically connects the electrical or electronic component housed in the package to a circuit board, and the base is configured to secure the package to the circuit board.

Aspect 2. The package according to aspect 1, wherein the header vent has a semicircle shape or a circle segment shape.

Aspect 3. The package according to aspect 1 or aspect 2, wherein the base has a substantially rectangular or square shape.

Aspect 4. The package according to any of aspects 1-3, wherein the base includes a rail, the rail includes a notch that recedes from a middle portion of a first edge of the base, the notch has a substantially rectangular shape.

Aspect 5. The package according to any of aspects 1-4, wherein the at least one terminal includes a pad.

Aspect 6. The package according to any of aspects 1-4, wherein the at least one terminal includes a first segment extending from the base in a direction parallel to an outer surface of the round top portion.

Aspect 7. The package according to aspect 6, wherein the at least one terminal includes a second segment extending from the first segment away from the round top portion in a direction perpendicular to the outer surface of the round top portion.

Aspect 8. The package according to aspect 6, wherein the at least one terminal includes a second segment extending from the first segment towards the round top portion in a direction perpendicular to the outer surface of the round top portion.

Aspect 9. The package according to any of aspects 1-8, wherein an edge of the first opening aligns with a circumference of the round top portion,
an edge of the second opening aligns with an edge of the cavity of the base.

Aspect 10. The package according to any of aspects 1-9, further comprising:
a cap configured to confine the electric or electronic component between the mount and the cap,
wherein the cap is mated or attached to the mount, the header, the electrical or electronic component, the at least one terminal, the round top portion, the cavity, or the rail.

Aspect 11. The package according to aspect 10, wherein the cap includes a cap vent to allow the substance to flow into and out of the interior of the hollow cylindrical support portion, and the cap vent aligns with the header vent.

Aspect 12. The package according to aspect 10, wherein a periphery of the cap aligns with a periphery of the base.

Aspect 13. An electric circuit system, comprising:
a package for housing an electric or electronic component, the package including a mount configured to house the electric or electronic component therein; and
a circuit board,
wherein the mount includes a cylinder header and a base secured to the cylinder header, the cylinder header includes a first end and a second end, a top portion of the cylinder header is secured to the first end, the base is secured to the second end, the base includes at least one terminal that electrically connects the electrical or electronic component housed in the mount to the circuit board, and the base is configured to secure the package to the circuit board, and
wherein the circuit board has a circular hole, and the cylinder header aligns with the circular hole.

Aspect 14. The system according to aspect 13, wherein the base and the round top portion of the cylinder header is located at a first side of the circuit board, the round top portion is further away from the first side of the circuit board relative to the base.

Aspect 15. The system according to aspect 14, wherein the package includes a cap configured to confine the electric or electronic component between the mount and the cap,
wherein the cap is mated or attached to the mount, the header, the electrical or electronic component, the at least one terminal, the round top portion, the cavity, or the rail.

Aspect 16. The system according to aspect 15, wherein the cap includes a cap vent to allow a substance to flow into and out of an interior of the header, and the cap vent aligns with a header vent of the top portion.

Aspect 17. The system according to aspect 13, wherein the cylinder header of the mount is at least partially through the circular hole of the circuit board.

Aspect 18. The system according to aspect 17, wherein the package includes a cap configured to confine the electric or electronic component between the mount and the cap,
wherein the cap is mated or attached to the mount, the header, the electrical or electronic component, the at least one terminal, the round top portion, the cavity, or the rail.

Aspect 19. The system according to aspect 18, wherein the cap includes a cap vent to allow a substance to flow into and out of an interior of the header, and the cap vent aligns with a header vent of the top portion.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, indicate the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts, without departing from the scope of the present disclosure. The word "embodiment" as used within this specification may, but does not necessarily, refer to the same embodiment. This specification and the embodiments described are examples only. Other and further embodiments may be devised without departing from the basic scope thereof, with the true scope and spirit of the disclosure being indicated by the claims that follow.

What is claimed is:
1. A package for housing an electric or electronic component, the package comprising:
a mount, the mount including:
a header that includes a top portion and a hollow support portion; and
a base,
wherein the hollow support portion has a first end and a second end, the first end defines a first opening, and the second end defines a second opening,
wherein the top portion is secured to the first end of the hollow support portion, the top portion covers the first opening, and the top portion includes a header vent to allow a substance to flow into and out of an interior of the hollow support portion,
wherein the header is configured to house the electric or electronic component therein,
wherein the base is secured to the second end of the hollow support portion, the base has a cavity, and the base is configured to secure the package to a circuit board,
wherein the base includes a rail, the rail includes a notch that recedes from a middle portion of a first edge of the base, the notch has a substantially rectangular shape.
2. The package according to claim 1, wherein the base has a substantially rectangular or square shape.

3. The package according to claim 1, wherein an edge of the first opening aligns with a circumference of the top portion, an edge of the second opening aligns with an edge of the cavity of the base.

4. The package according to claim 1, wherein the base includes at least one terminal that electrically connects the electrical or electronic component housed in the package to the circuit board.

5. The package according to claim 1, further comprising:

a cap configured to confine the electric or electronic component between the mount and the cap, wherein the cap is attached to the rail of the base.

6. The package according to claim 5, wherein the cap includes a cap vent to allow the substance to flow into and out of the interior of the hollow support portion, and the cap vent aligns with the header vent.

7. An electric circuit system, comprising:

a package for housing an electric or electronic component, the package including a mount configured to house the electric or electronic component therein; and a circuit board, wherein the mount includes a header and a base secured to the header, the header includes a first end and a second end, a top portion of the header is secured to the first end, the base is secured to the second end, and the base is configured to secure the package to the circuit board, wherein the circuit board has a circular hole, and the header aligns with the circular hole, and wherein the header of the mount is at least partially through the circular hole of the circuit board.

8. The system according to claim 7, wherein the base includes at least one terminal that electrically connects the electrical or electronic component housed in the mount to the circuit board.

9. The system according to claim 7, wherein the package includes a cap configured to confine the electric or electronic component between the mount and the cap, wherein the cap is attached to a rail of the base.

10. The system according to claim 9, wherein the cap includes a cap vent to allow a substance to flow into and out of an interior of the header, and the cap vent aligns with a header vent of the top portion.

* * * * *